United States Patent
Zhang et al.

(10) Patent No.: US 8,288,867 B2
(45) Date of Patent: Oct. 16, 2012

(54) SEMICONDUCTOR CONSTRUCTIONS

(75) Inventors: Tianhong Zhang, Boise, ID (US); Akram Ditall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 335 days.

(21) Appl. No.: 12/785,263

(22) Filed: May 21, 2010

(65) Prior Publication Data

US 2010/0230819 A1  Sep. 16, 2010

Related U.S. Application Data

(62) Division of application No. 11/639,771, filed on Dec. 15, 2006, now Pat. No. 7,749,885.

(51) Int. Cl.
*H01L 29/40* (2006.01)

(52) U.S. Cl. ........... 257/766; 257/758; 257/E21.237; 438/612

(58) Field of Classification Search .......... 257/758, 257/766, E21.237; 438/612
See application file for complete search history.

(56) References Cited

U.S. PATENT DOCUMENTS

| | | | | |
|---|---|---|---|---|
| 5,136,364 A | * | 8/1992 | Byrne | 257/751 |
| 5,563,102 A | * | 10/1996 | Michael | 438/614 |
| 6,222,270 B1 | * | 4/2001 | Lee | 257/758 |
| 6,717,238 B2 | * | 4/2004 | Ker et al. | 257/602 |
| 6,822,329 B2 | * | 11/2004 | Varrot et al. | 257/758 |
| 7,338,908 B1 | | 3/2008 | Koos et al. | |
| 7,550,850 B2 | | 6/2009 | Nakashiba | |
| 2006/0022352 A1 | * | 2/2006 | Moore et al. | 257/786 |
| 2007/0205508 A1 | * | 9/2007 | Hsia et al. | 257/734 |

OTHER PUBLICATIONS

Horvath, Z.E. et al., Enhancement of oxidation resistance in Cu and Cu(Al) thin layers, Nuclear Instruments and Methods in Physics Research B 148 (1999) 868-871.

Powell, Ron et al., Characterization of copper oxidation and reduction using spectroscopic ellipsometry, Proceedings of SPIE vol. 4182 (2000) 97-105.

* cited by examiner

*Primary Examiner* — Jerome Jackson, Jr.
*Assistant Examiner* — Paul Budd
(74) *Attorney, Agent, or Firm* — Wells St. John P.S.

(57) ABSTRACT

Some embodiments include semiconductor processing methods in which a copper barrier is formed to be laterally offset from a copper component, and in which nickel is formed to extend across both the barrier and the component. The barrier may extend around an entire lateral periphery of the component, and may be spaced from the component by an intervening ring of electrically insulative material. The copper component may be a bond pad or an interconnect between two levels of metal layers. Some embodiments include semiconductor constructions in which nickel extends across a copper component, a copper barrier is laterally offset from the copper component, and an insulative material is between the copper barrier and the copper component.

13 Claims, 21 Drawing Sheets

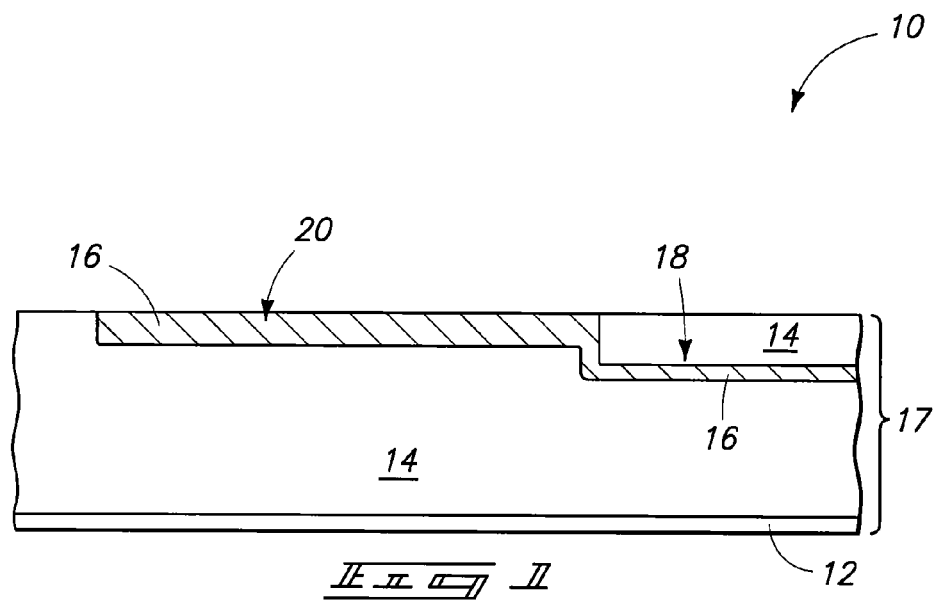
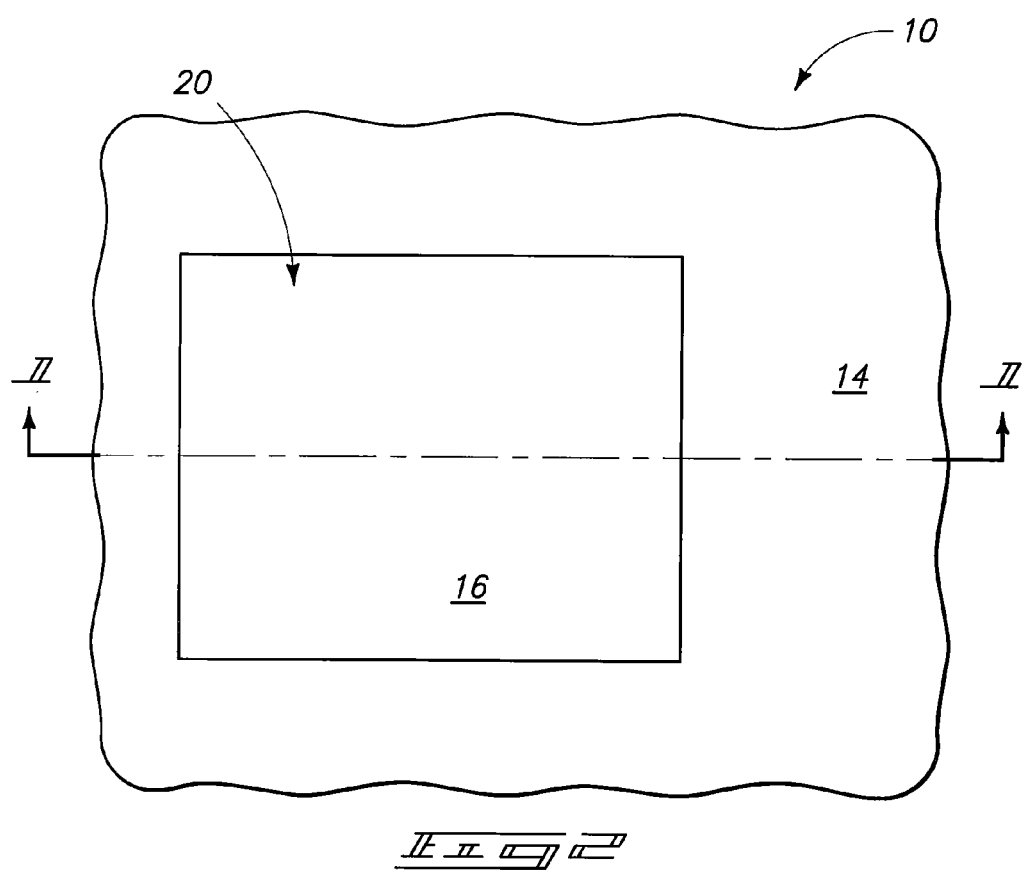

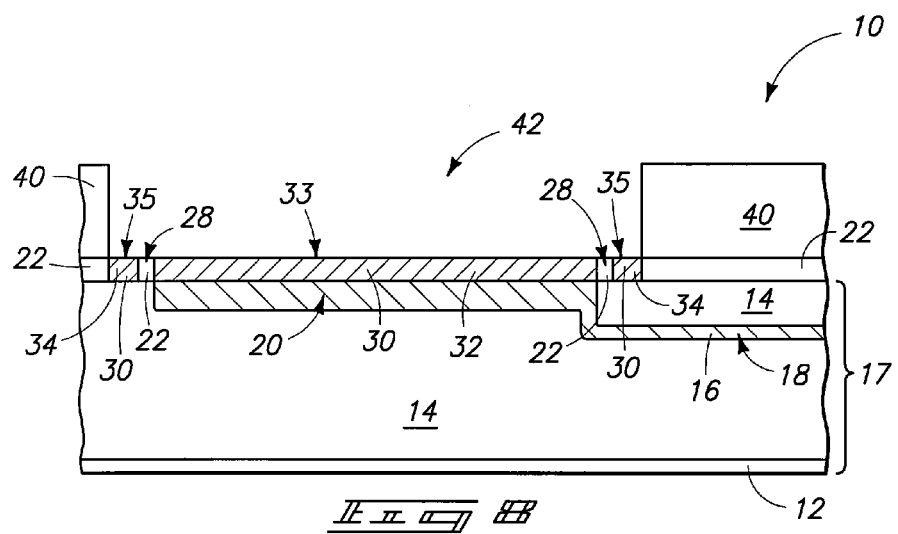
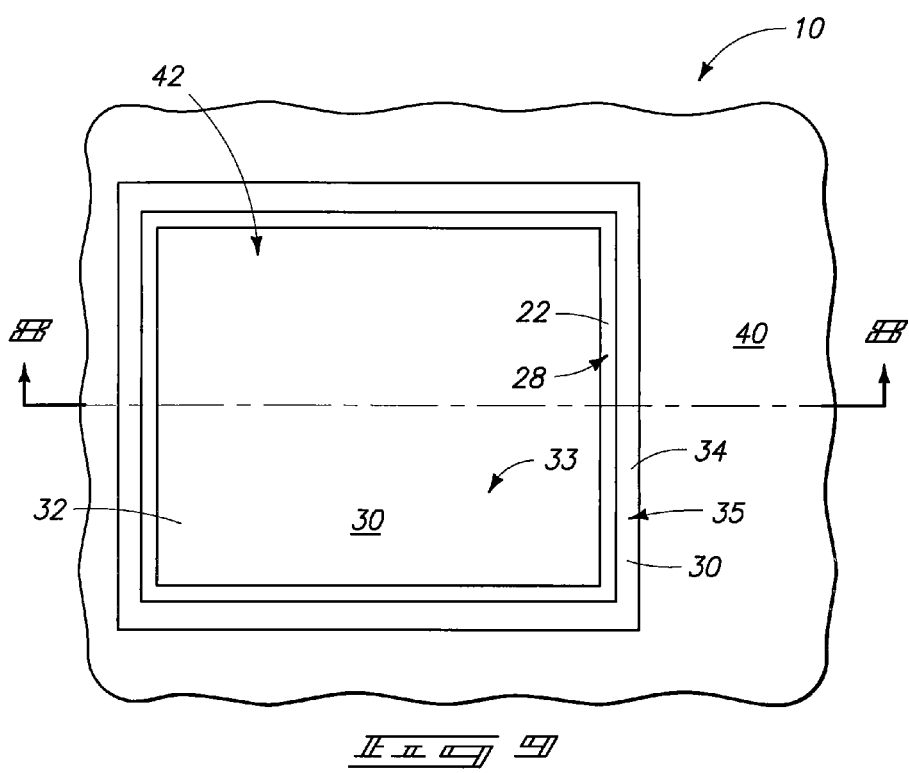

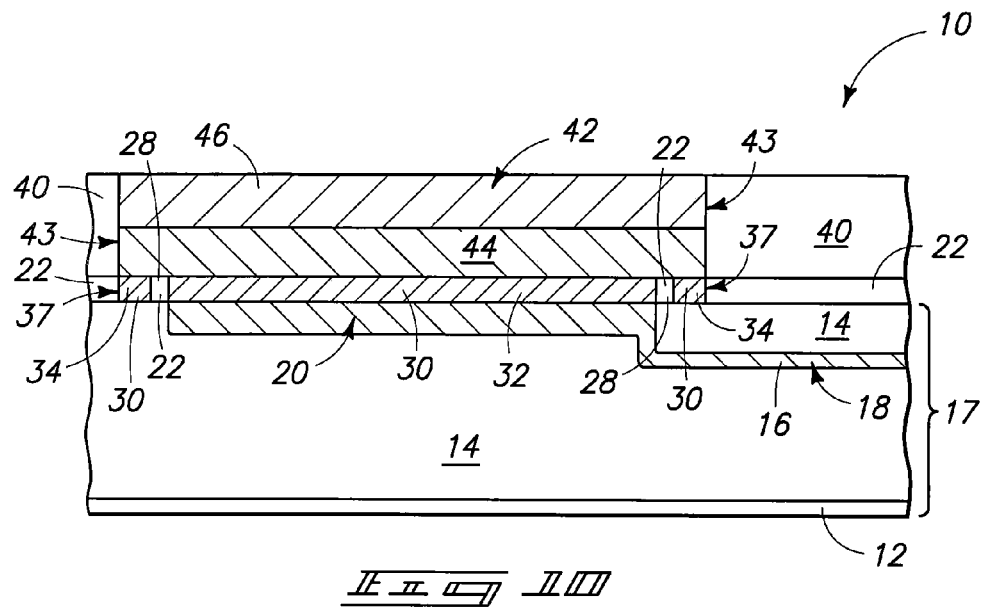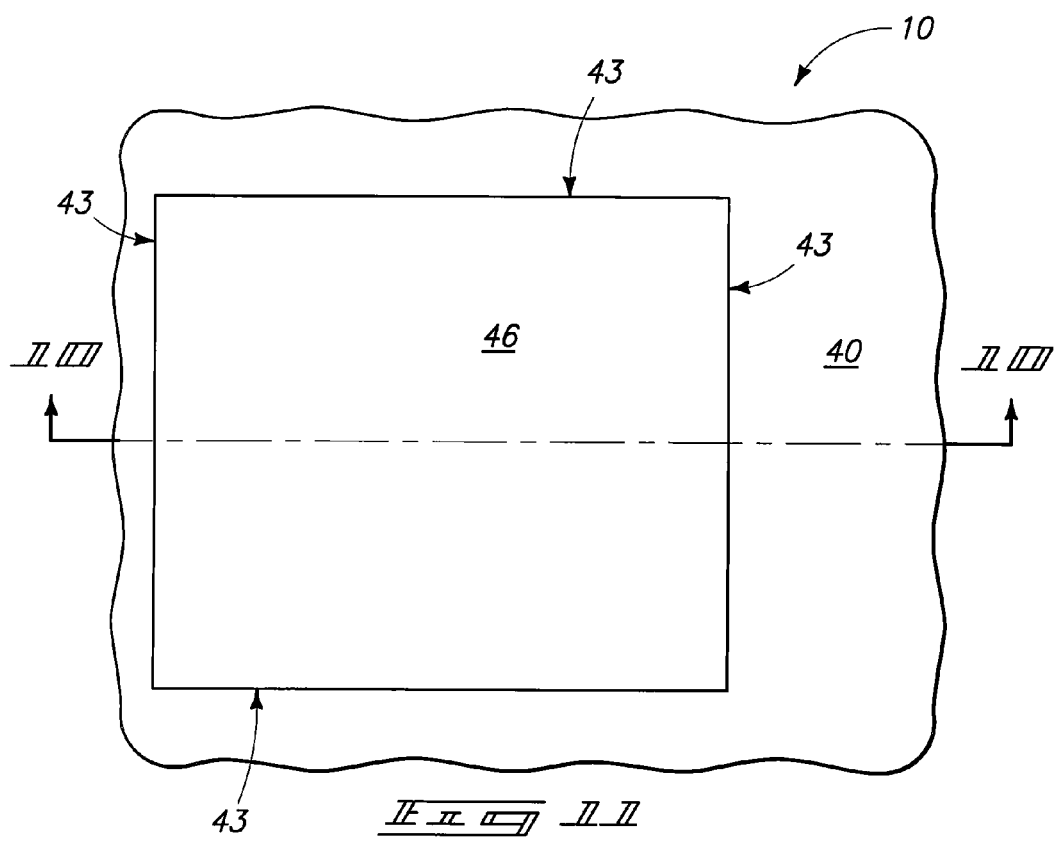

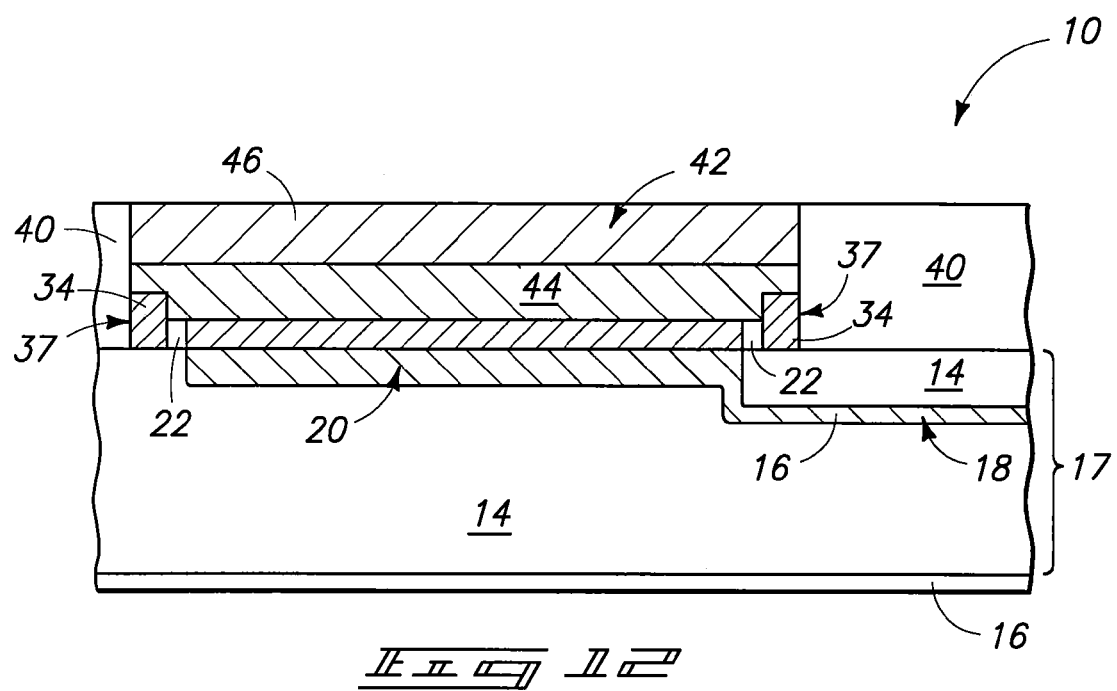

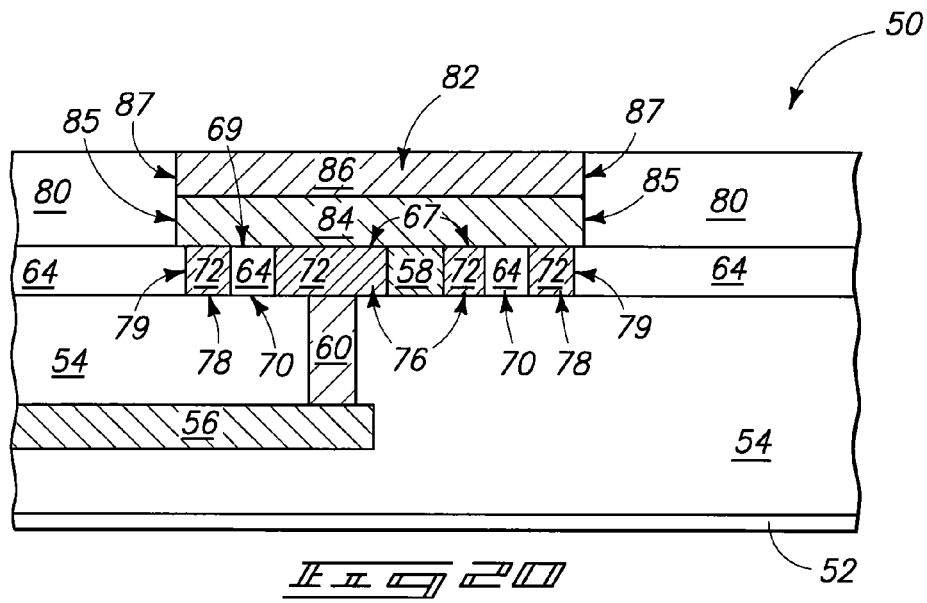
_FIG 20_
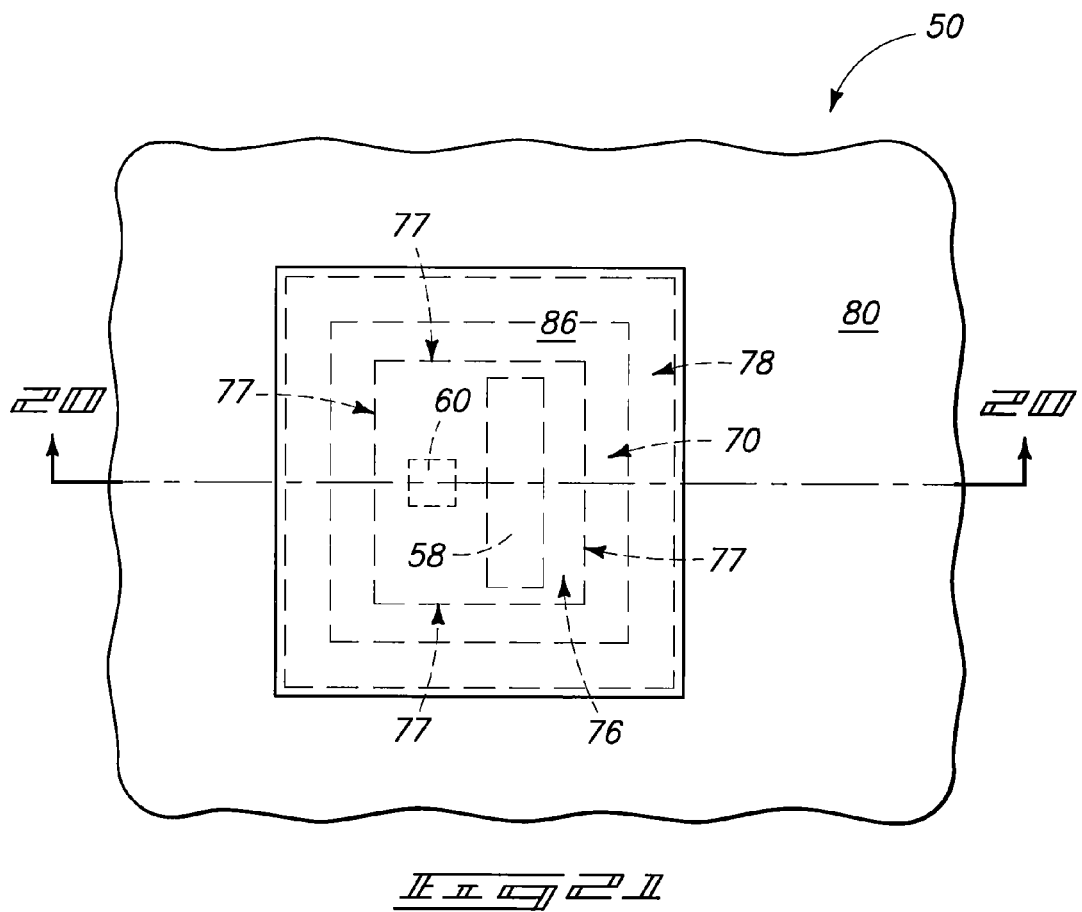
_FIG 21_

US 8,288,867 B2

SEMICONDUCTOR CONSTRUCTIONS

RELATED PATENT DATA

This patent resulted from a divisional of U.S. patent application Ser. No. 11/639,771, which was filed Dec. 15, 2006, and which is hereby incorporated herein by reference.

TECHNICAL FIELD

Semiconductor constructions, semiconductor processing methods, methods of forming contact pads, and methods of forming electrical connections between metal-containing layers.

BACKGROUND

Copper is commonly utilized in structures of integrated circuit (IC) chips. For instance, copper lines may be utilized for wiring; and copper pads may be utilized as bond pad regions associated with an IC chip for connection to circuitry external of the chip.

Copper is readily oxidized upon exposure to air. Accordingly, protective materials are frequently provided over the copper utilized in IC chips. Such protective materials may be a combination of nickel and gold, or a combination of nickel and palladium. Specifically, nickel may be electroless plated directly on the copper, and subsequently gold or palladium may be formed directly over the nickel.

The copper and protective materials thereover will frequently be surrounded by insulative material (such as silicon dioxide). A problem may occur with the insulative material poorly adhering to the protective materials so that cracks develop between the protective materials and the insulative material. Such cracks may permit oxidants (such as $O_2$ or water vapor) to reach the copper. The oxidants may then oxidize the copper and create defects which propagate through the copper and impair performance of an IC chip.

BRIEF DESCRIPTION OF THE DRAWINGS

FIGS. 1 and 2 are a diagrammatic cross-sectional view and diagrammatic top view, respectively, of a semiconductor wafer fragment at a preliminary processing stage of an embodiment of the invention. The cross-section of FIG. 1 is along the line 1-1 of FIG. 2.

FIGS. 8 and 9 are a cross-sectional view and a top view, respectively, of the fragment of FIGS. 1 and 2 shown at a processing stage subsequent to that of FIGS. 6 and 7. The cross-section of FIG. 8 is along line 8-8 of FIG. 9.

FIGS. 10 and 11 are a cross-sectional view and a top view, respectively, of the fragment of FIGS. 1 and 2 shown at a processing stage subsequent to that of FIGS. 8 and 9. The cross-section of FIG. 10 is along line 10-10 of FIG. 11.

FIG. 12 is a view of the fragment of FIG. 1 shown at a processing stage subsequent to that of FIGS. 1 and 2 in accordance with another embodiment of the invention.

FIGS. 20 and 21 are a cross-sectional view and a top view, respectively, of the fragment of FIGS. 13 and 14 shown at a processing stage subsequent to that of FIGS. 18 and 19. The cross-section of FIG. 20 is along line 20-20 of FIG. 21.

DETAILED DESCRIPTION

Figure 3:
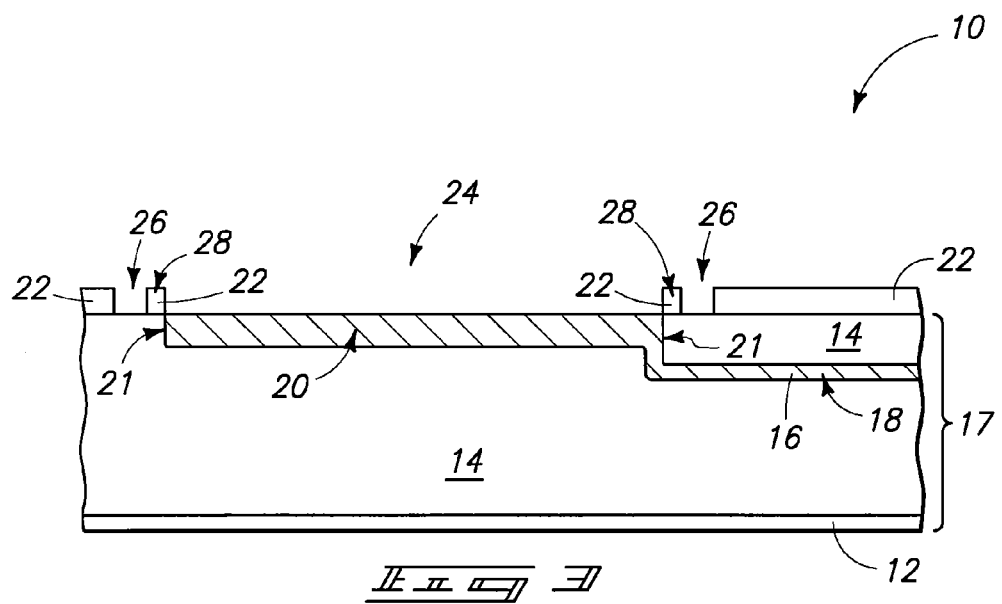
FIGS. 3 and 4 are a cross-sectional view and a top view, respectively, of the fragment of FIGS. 1 and 2 shown at a processing stage subsequent to that of FIGS. 1 and 2. The cross-section of FIG. 3 is along line 3-3 of FIG. 4.

Some embodiments include provision of a barrier (or guard) copper structure laterally offset from a copper-containing IC component. The barrier blocks moisture and/or oxygen from reaching copper of the IC component. The IC component may be, for example, a bond pad region or an interconnect between two levels of metal.

One embodiment of the invention is described with reference to FIGS. 1-11.

FIGS. 1 and 2 show a fragment of a semiconductor construction 10 at a preliminary processing stage. The construction comprises a semiconductor base 12, electrically insulative material 14 over the base, and electrically conductive material 16 also over the base.

Base 12 may comprise semiconductor material having various IC components (not shown) therein and supported thereby. For instance, base 12 may comprise a portion of a monocrystalline silicon wafer, and may have numerous circuit components (such as memory and/or logic circuitry) fabricated to be incorporated into an IC chip comprising base 12. To aid in interpretation of the claims that follow, the terms "semiconductive substrate," "semiconductor construction" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Base 12, insulative material 14, and conductive material 16 may thus be together referred to as a semiconductor substrate 17.

Although base 12 is shown having a planar upper topography, various circuit components may be formed over base 12 and/or extending into base 12 to create a more complex topography than that shown.

Insulative material 14 may comprise any suitable composition or combination of compositions. For instance, material 14 may comprise one or more of silicon dioxide, silicon nitride and parylene. Although insulative material 14 is shown to be homogeneous, the material may comprise numerous discrete layers and structures. Further, various electrically conductive structures (not shown) may extend within material 14 in addition to the electrically conductive material 16.

Electrically conductive material 16 may comprise any suitable composition or combination of compositions, including, for example, one or more of various metals (for instance, copper, tungsten, titanium and aluminum), metal compositions (for instance, metal nitrides and metal silicides) and conductively-doped semiconductor materials (for instance, conductively-doped silicon).

Conductive material 16 is shown patterned as a line. The line has a region 18 encapsulated by insulative material 14, and has another region 20 with an exposed upper surface. The region 20 may correspond to a bond pad (or contact pad) region. Specifically, region 20 may be configured for having a bond pad formed thereon. Such bond pad may ultimately be utilized for connecting circuitry (not shown) external of construction 10 to conductive material 16. Conductive material 16 may then function as an interconnect line between the circuitry external of construction 10 and integrated circuitry comprised by construction 10. In some embodiments, conductive material 16 may be considered to comprise an electrically conductive lead 18, and a bond pad region 20 joined to such lead. Electrically insulative material 14 may be considered to be over such lead and laterally surrounding the bond pad region. The bond pad region 20 may alternatively be referred to as a bond pad location, since it may be considered to define a location where a bond pad will ultimately be formed.

Bond pad region 20 is an example of an electrically conductive component region that may be exposed on a surface of a semiconductor construction. Other component regions may include, for example, interconnect regions, as described below with reference to FIGS. 13-37.

Figure 4:
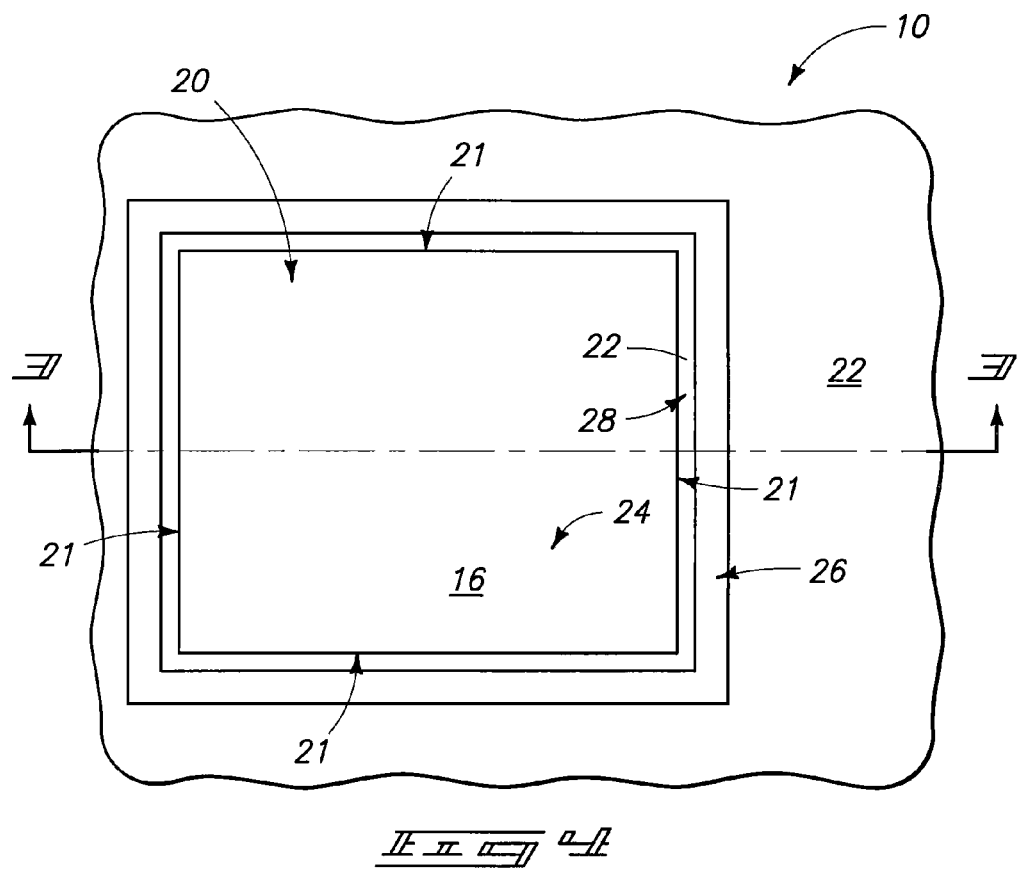

Referring to FIGS. 3 and 4, patterned electrically insulative material 22 is formed over semiconductor substrate 17. Patterned material 22 has a first opening 24 extending therethrough to expose at least a portion of contact pad region 20 (and is shown exposing an entirety of contact pad region 20), and has a second opening 26 extending therethrough to expose insulative material 14 proximate the contact pad region 20.

Electrically insulative material 22 may be patterned with any suitable processing. For instance, a layer of material 22 may be formed across substrate 17, a patterned photoresist mask may be formed over the layer utilizing photolithographic processing, an etch may be utilized to transfer a pattern from the mask to layer 22, and subsequently the mask may be removed to leave the patterned layer 22 of FIGS. 3 and 4.

Contact pad region 20 comprises a lateral periphery 21 corresponding to a perimeter of the contact pad region. First opening 24 is shown to have a lateral periphery corresponding to the lateral periphery 21 of the contact pad region. Second opening 26 is shown to surround the lateral peripheries of the first opening and the contact pad region.

First opening 24 may be referred to as a component pattern, in that the first opening ultimately defines a location for a conductive component formed over bond pad region 20. Second opening 26 may be referred to as an annulus pattern surrounding a lateral periphery of the component pattern. Second opening 26 may alternatively be referred to as a barrier pattern, in that the second opening ultimately defines a location for a barrier.

Second opening 26 is spaced from first opening 24 by a ring (or segment) 28 of insulative material 22. Thus, second opening 26 is laterally offset from first opening 24. Although the second opening is shown to surround the lateral periphery of the first opening, in other embodiments the second opening may extend along only a portion of the lateral periphery of the first opening.

Insulative material 22 may comprise any suitable composition or combination of compositions, and may, for example, comprise, consist essentially of or consist of silicon dioxide.

Figure 5:
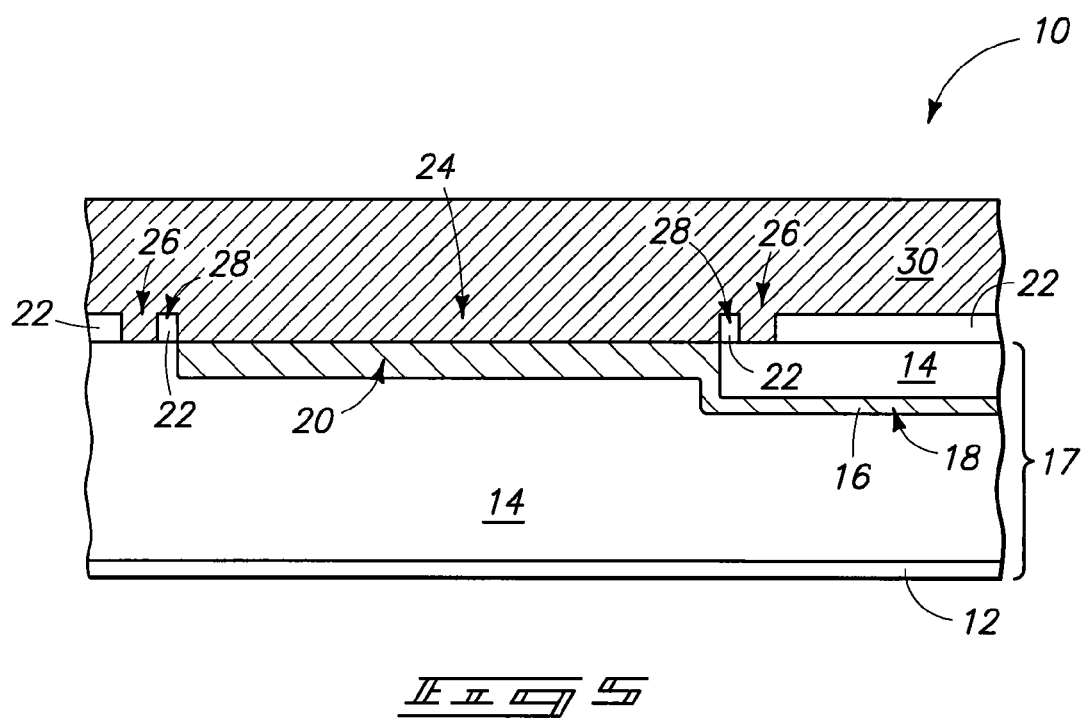
FIG. 5 is a view of the fragment of FIG. 1 shown at a processing stage subsequent to that of FIGS. 3 and 4.

Referring to FIG. 5, electrically conductive material 30 is formed across patterned electrically insulative material 22, and within the first and second openings 24 and 26. Electrically conductive material 30 may comprise any suitable composition or combination of compositions, and may, for example, comprise, consist essentially of, or consist of copper.

Figure 6:
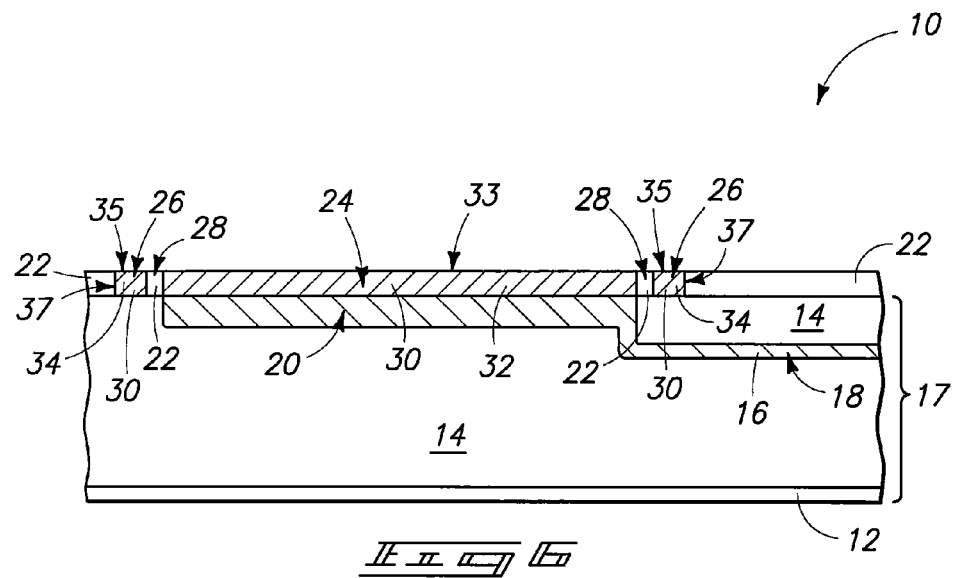
FIGS. 6 and 7 are a cross-sectional view and a top view, respectively, of the fragment of FIGS. 1 and 2 shown at a processing stage subsequent to that of FIG. 5. The cross-section of FIG. 6 is along line 6-6 of FIG. 7.
Figure 7:
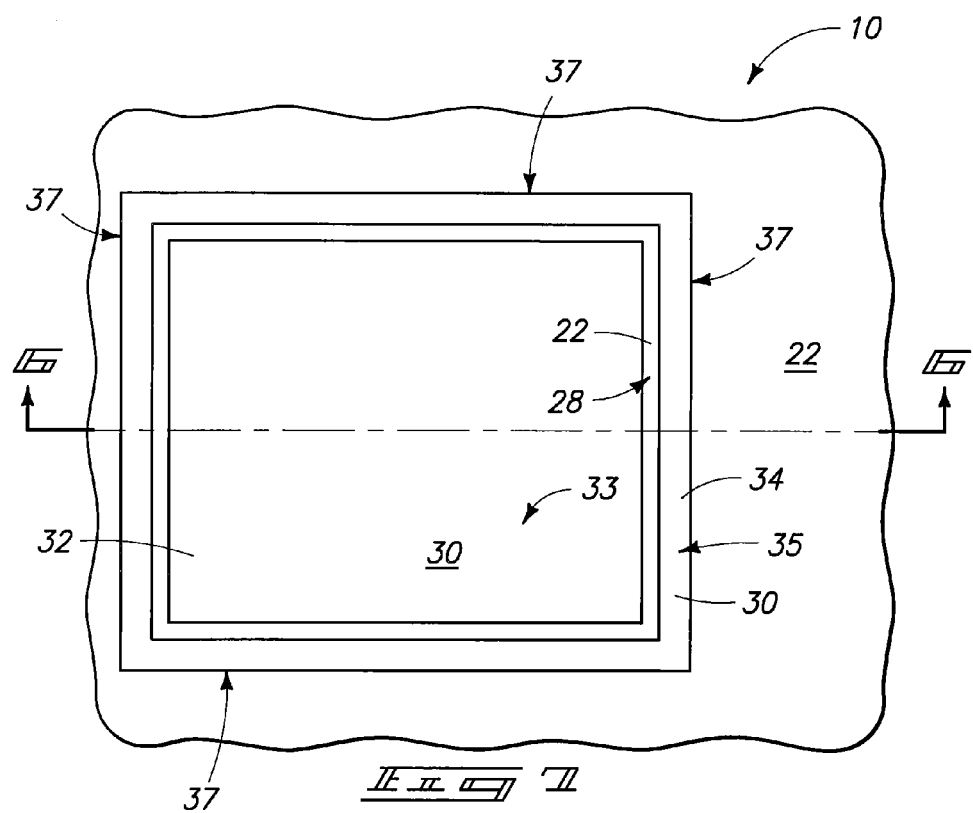

Referring to FIGS. 6 and 7, conductive material 30 is removed from over insulative material 22, while leaving the conductive material within openings 24 and 26. Accordingly, the conductive material 30 within opening 26 becomes electrically isolated from that within opening 24. The conductive material 30 remaining within opening 24 may be referred to as a component 32, and the conductive material 30 remaining within opening 26 may be referred to as a barrier (or guard) 34. The shown barrier 34 corresponds to an annulus surrounding component 32. Component 32 and barrier 34 may be considered to have a first electrically conductive upper surface 33 and a second electrically conductive surface 35, respectively.

Barrier 34 has an outer lateral periphery 37 along a sidewall of opening 26.

Conductive material 30 may be removed from over insulative material 22 utilizing any suitable method or combination methods, such as, for example, planarization through chemical-mechanical polishing (CMP). The structure of FIG. 6 comprises material 30 within openings 24 and 26, but not over the ring 28 of insulative material 22. The structure of FIG. 6 may be formed by processing other than that of FIGS. 1-5, including, for example, forming conductive material 30 only in openings 24 and 26; rather than forming the material over an entirety of substrate 17 and then planarizing the material to leave it only in openings 24 and 26.

The barrier 34 may comprise any suitable dimension and may be laterally offset from component 32 by any suitable distance. Component 32 may comprise a width of about 100 microns in the cross-sectional view of FIG. 6. Barrier 34 may comprise a width of from about 1000 angstroms to about 5000 angstroms, and may be laterally offset from component 32 by a distance of from about 1000 angstroms to about 2000 angstroms.

Referring to FIGS. 8 and 9, a patterned electrically insulative material 40 is formed over insulative material 22. Insulative materials 22 and 40 may be referred to as first and second electrically insulative materials, respectively. Insulative material 40 may comprise any suitable composition or combination of compositions. In some embodiments, material 40 may be the same composition as material 22. For instance, materials 22 and 40 may both comprise, consist essentially of, or consist of silicon oxide. Material 40 may be patterned utilizing processing similar to that discussed above for the patterning of material 22 of FIGS. 3 and 4.

Patterned material 40 has an opening 42 extending therethrough. Such opening may be referred to as a third opening to distinguish it from the first and second openings 24 and 26.

The upper surface 33 of component 32 is exposed along a bottom periphery of opening 42, and at least a portion of upper surface 35 of barrier 34 is also exposed along the bottom periphery of opening 42. In the shown embodiment, an entirety of upper surface 35 is exposed. In other embodiments, only a portion of upper surface 35 may be exposed.

An upper surface of ring 28 of insulative material 22 is also exposed along a bottom periphery of opening 42.

Referring to FIGS. 10 and 11, conductive material 44 is formed across the bottom periphery of opening 42. In the shown embodiment, conductive material 44 only partially fills opening 42, and another conductive material 46 is formed over material 44 to fill a remaining portion of opening 42.

Conductive material 44 may comprise any suitable composition or combination of compositions, and may, for example, comprise, consist essentially of, or consist of nickel. Conductive material 44 may be directly against component 32, barrier 34 and ring 28, as shown.

Conductive material 44 may be formed by electroless plating nickel over copper-containing material 30 of component 32 and barrier 34. The electroless-plated nickel may form on component 32 and barrier 34, and then merge to bridge across ring 28 of insulative material 22.

Conductive material 46 may comprise any suitable composition or combination of compositions, and may, for example, comprise, consist essentially of, or consist of one or both of gold and palladium. Conductive material 44 may be considered to form a first structure within opening 42, and conductive material 46 may be considered to form a second structure within the opening and over the first structure.

The component 32 of FIGS. 10 and 11 may be considered to be a bond pad which is over and in direct contact with conductive material 16 of the bond pad region 20 (with the term "direct contact" meaning that there are no intervening materials between component 32 and material 16). The bond pad has a lateral periphery which is entirely surrounded by the electrically conductive annulus corresponding to barrier 34. The ring 28 of insulative material 22 separates such annulus from the bond pad. Conductive material 44 may be considered a segment of conductive material which is over and in direct contact with the bond pad, the annulus, and the ring of insulative material between such bond pad and annulus.

Conductive materials 44 and 46 have a lateral periphery 43 along a sidewall of opening 42. Lateral periphery 43 of materials 44 and 46, together with a lateral periphery 37 of barrier 34, forms an outer conductive wall. Insulative materials 22 and 40 are along such outer conductive wall. In some embodiments, insulative materials 22 and 40 may both comprise silicon dioxide so that the outer conductive wall is along an interface with silicon dioxide. As discussed in the "background" section of this disclosure, a problem which may occur is that a crack may form between silicon dioxide and materials comprising nickel, gold or palladium. Thus, a crack may occur between lateral periphery 43 and insulative material 40. Such crack may expose barrier 34 to oxidative conditions. Barrier 34 may oxidize if such crack occurs, but the oxidation will be precluded from propagating to component 32 by the intervening insulative material 22 of ring 28. Thus, the prior art problem of oxidation of copper-containing components may be avoided.

A method of ascertaining robustness of a particular construction relative to oxidation is a highly-accelerated temperature and humidity stress test (HAST). The HAST may employ a temperature of about 130° C., a relative humidity of about 85 percent, a pressure of about 230 kilopascals, and an exposure time of about 96 hours. Constructions of the type shown in FIGS. 10 and 11 are found to survive such HAST with no damage to component 32, whereas prior art structures may suffer significant damage to a bond pad under such HAST.

The embodiment of FIGS. 10 and 11 has barrier 34 formed of the same composition as component 32, and formed to the same height as component 32. In other embodiments, barrier 34 may be formed of a different composition than component 32, and/or may be formed to a different height than component 32. In such other embodiments, the processing of FIGS. 5-7 may be replaced with multiple maskings and depositions so that barrier 34 is formed sequentially relative to component 32; and thus barrier 34 may be formed to a different height and/or of a different composition than component 32. FIG. 12 shows an embodiment of construction 10 in which barrier 34 is formed to a different height than component 32. In such embodiment, component 32 and barrier 34 may comprise different compositions relative to one another. For instance, component 32 may comprise, consist essentially of or consist of copper; and barrier 34 may comprise, consist essentially of, or consist of aluminum. The embodiment of FIG. 12 also differs from that of FIGS. 9 and 10 in that insulative material 22 is not along the outer peripheral edges 37 of component 34, but rather insulative material 40 is along such outer edges.

Another embodiment of the invention is described with reference to FIGS. 13-21.

Figure 13:
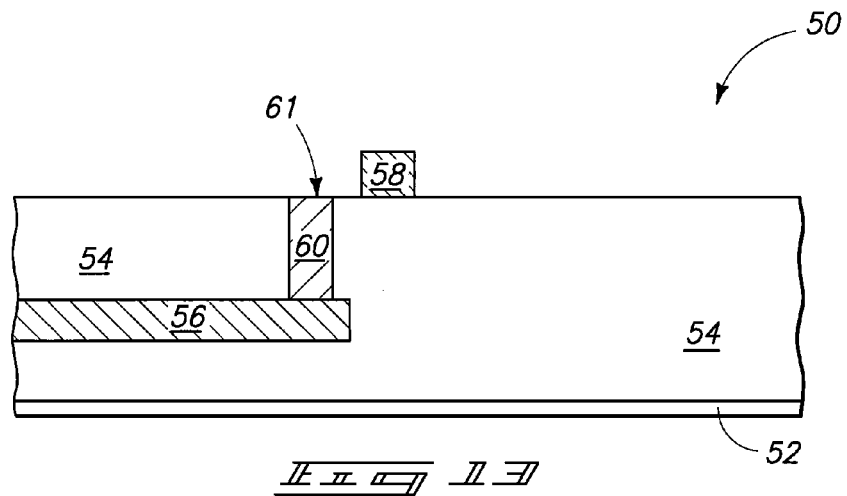
FIGS. 13 and 14 are a diagrammatic cross-sectional view and diagrammatic top view, respectively, of a semiconductor wafer fragment at a preliminary processing stage of another embodiment of the invention. The cross-section of FIG. 13 is along the line 13-13 of FIG. 14.
Figure 14:
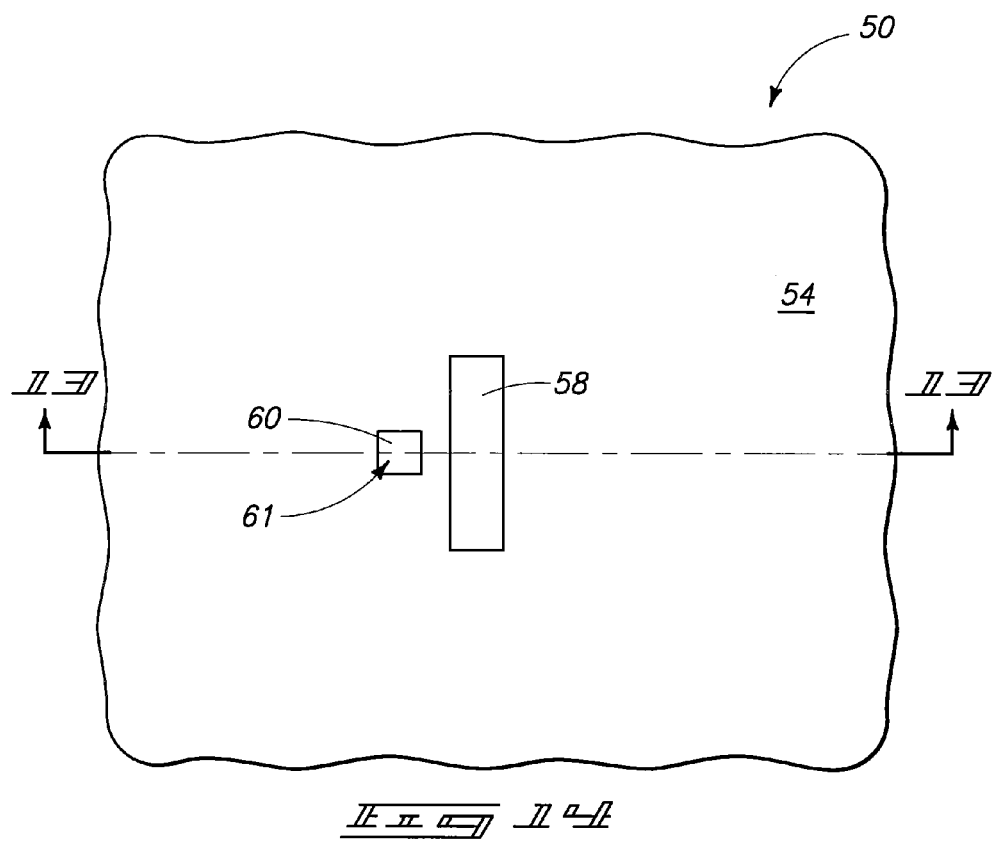

Referring to FIGS. 13 and 14, a semiconductor construction 50 is illustrated at a preliminary processing stage. Construction 50 comprises a semiconductor base 52, and electrically insulative material 54 over such base.

Base 52 may be identical to the base 12 discussed above with reference to FIGS. 1 and 2, and accordingly may comprise a semiconductor wafer having integrated circuitry associated therewith.

Insulative material 54 may comprise any suitable composition or combination of compositions, and may, for example, comprise, consist essentially of or consist of one or more of silicon nitride, silicon dioxide, and various doped silicon oxides (for instance, borophosphosilicate glass, BPSG; phosphosilicate glass, PSG; and fluorosilicate glass, FSG).

A first metal-containing layer 56 is within the insulative material 54, and a second metal-containing layer 58 is over insulative material 54. Metal-containing layer 56 may be part of a first metal level (for instance, so-called metal I), and metal-containing layer 58 may be part of a second metal level (for instance, so-called metal II).

An electrically conductive interconnect 60 extends from a surface of insulative material 54 to metal-containing layer 56. Interconnect 60 has an upper surface 61 proximate metal-containing layer 58. Ultimately, metal-containing layer 58 is to be electrically coupled to interconnect 60, and thereby electrically coupled to metal-containing layer 56.

Metal-containing layers 56 and 58 may comprise any suitable compositions or combinations of compositions, and may, for example, comprise, consist essentially of, or consist of one or more of various metals (such as copper, aluminum, titanium and tungsten) and metal-containing compositions (such as metal silicides and metal nitrides). Interconnect 60 may comprise any suitable composition or combination of compositions, including any of various metals, metal compositions, and/or conductively-doped semiconductor materials.

Base 52, insulative material 54, metal-containing layers 56 and 58, and interconnect 60 may be together referred to as a semiconductor substrate.

Figure 15:
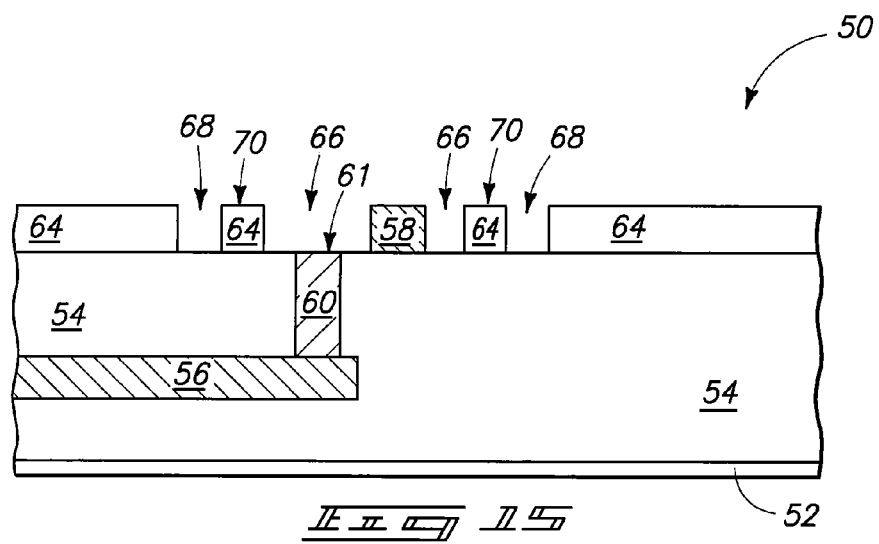
FIGS. 15 and 16 are a cross-sectional view and a top view, respectively, of the fragment of FIGS. 13 and 14 shown at a processing stage subsequent to that of FIGS. 13 and 14. The cross-section of FIG. 15 is along line 15-15 of FIG. 16.
Figure 16:
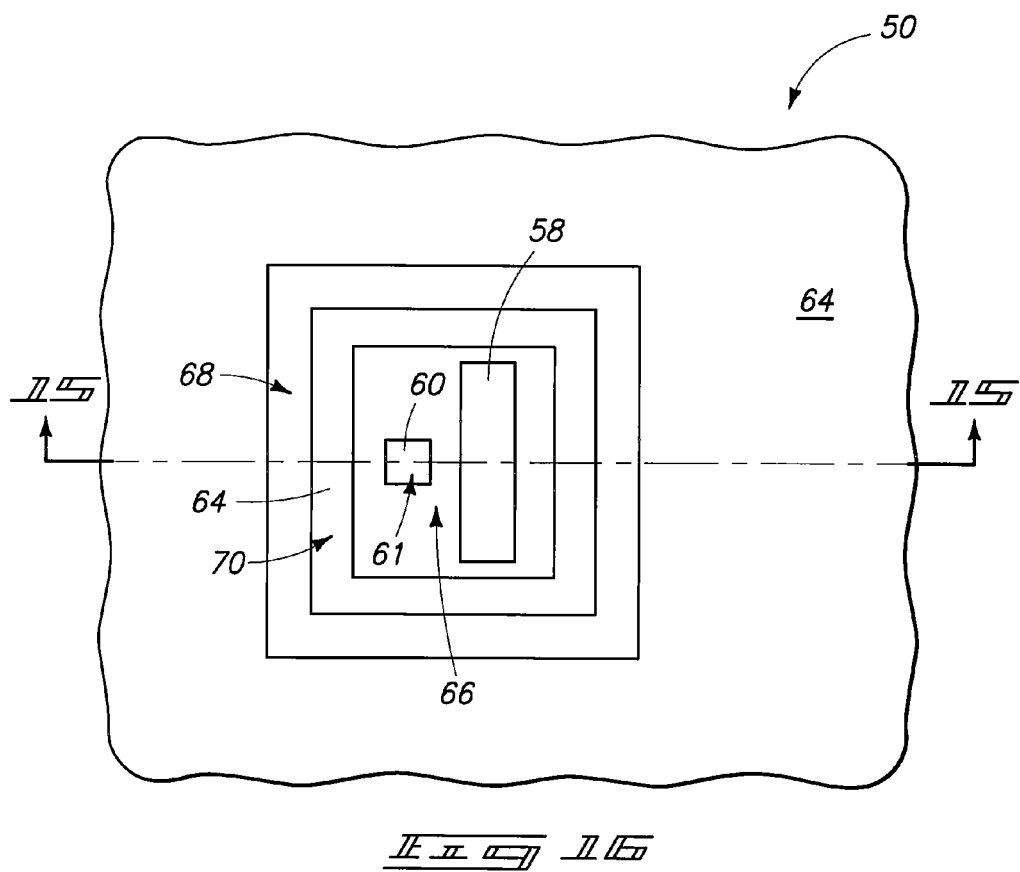

Referring to FIGS. 15 and 16, patterned electrically insulative material 64 is formed over insulative material 54. Material 64 may be referred to as a second electrically insulative material to distinguish it from the first electrically insulative material 54. Patterned material 64 has a first opening 66 extending therethrough to expose metal-containing layer 58 and upper surface 61 of interconnect 60, and has a second opening 68 extending therethrough to expose insulative material 54 proximate interconnect 60. Second opening 68 is laterally offset from first opening 66 by a segment 70 of insulative material 64. Opening 68 defines an annular ring extending around metal-containing material 58 and the upper surface of interconnect 60.

Material 64 may be patterned utilizing processing similar to that discussed above with reference to FIGS. 3 and 4 for patterning material 22. Material 64 may, for example, comprise, consist essentially of or consist of silicon dioxide.

Figure 17:
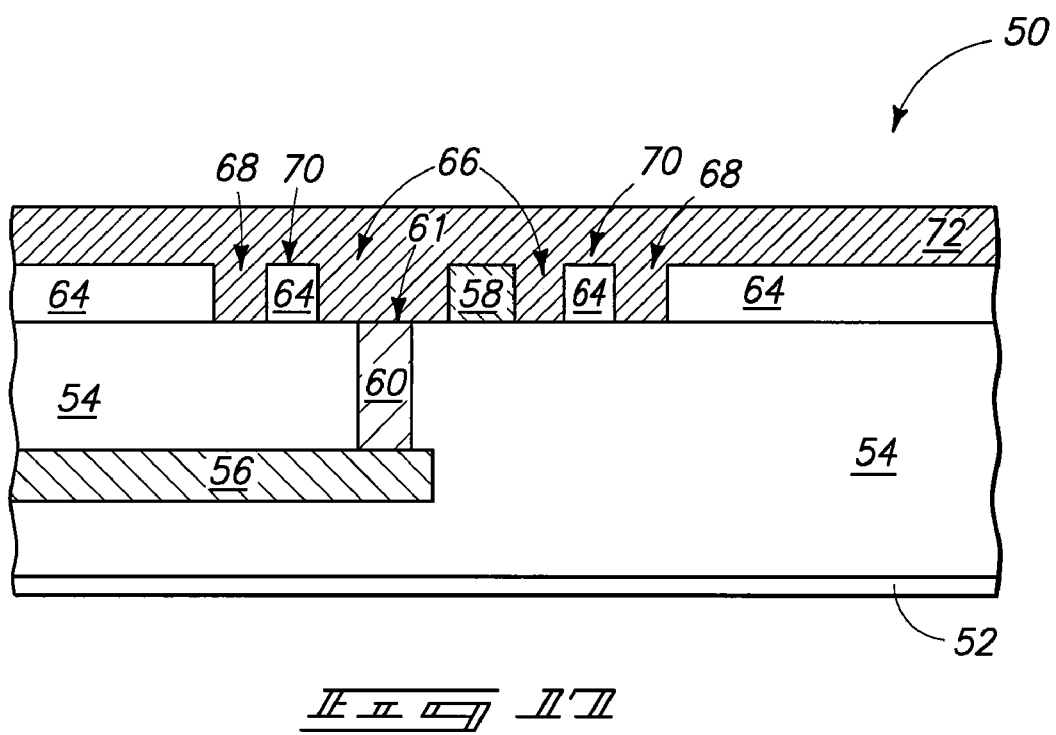
FIG. 17 is a view of the fragment of FIG. 13 shown at a processing stage subsequent to that of FIGS. 15 and 16.

Referring to FIG. 17, an electrically conductive material 72 is formed over metal-containing layer 58, and insulative material 64; and is formed within first and second openings 66 and 68. Material 72 may comprise, consist essentially of, or consist of copper; and may be referred to as a copper-containing material in some embodiments.

Figure 18:
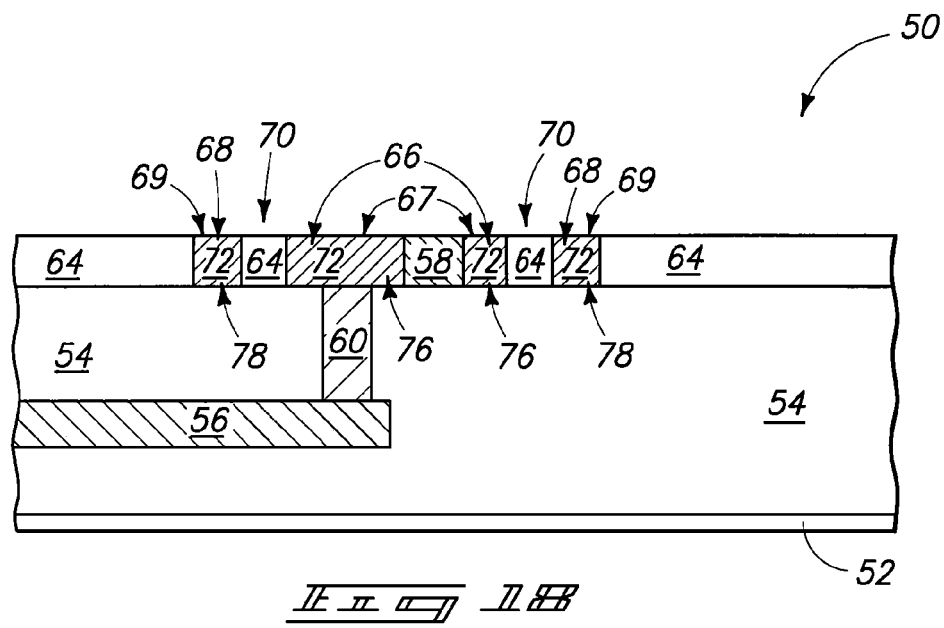
FIGS. 18 and 19 are a cross-sectional view and a top view, respectively, of the fragment of FIGS. 13 and 14 shown at a processing stage subsequent to that of FIG. 17. The cross-section of FIG. 18 is along line 18-18 of FIG. 19.
Figure 19:
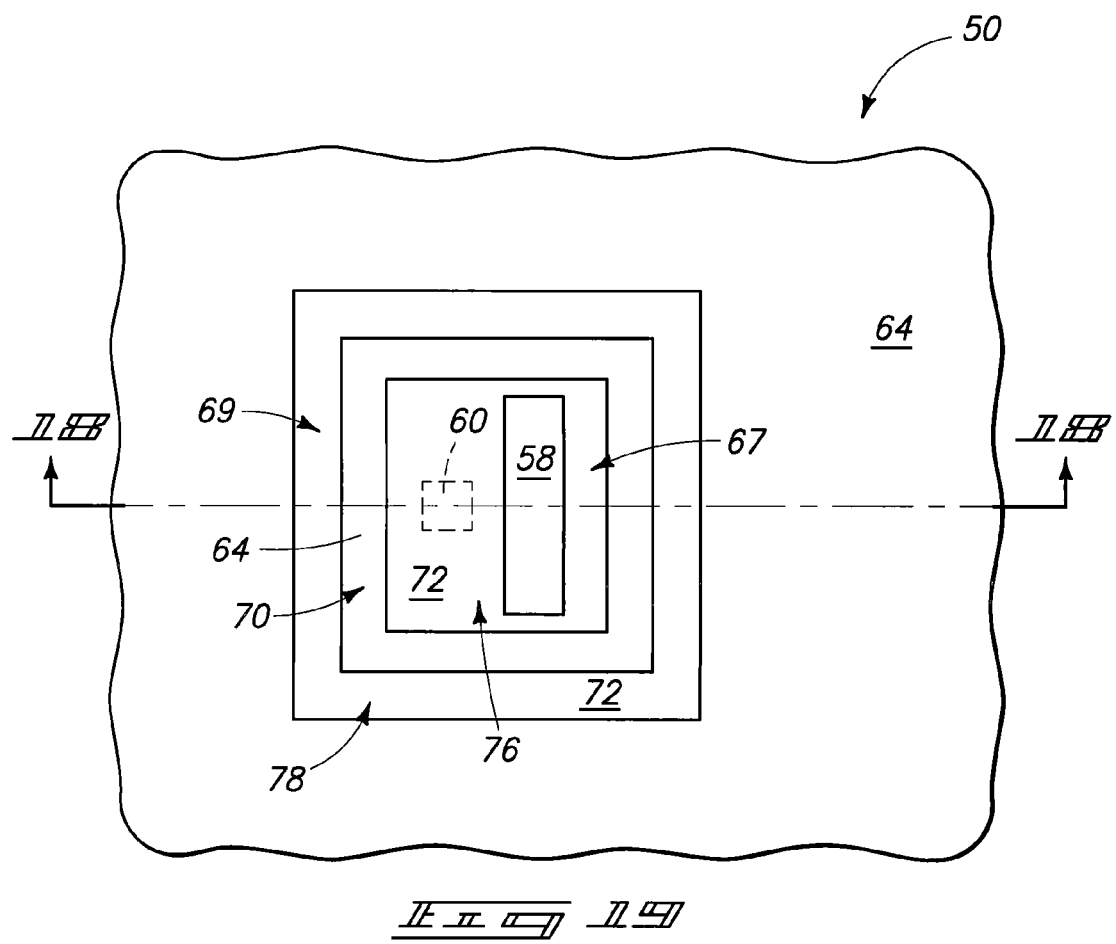

Referring to FIGS. 18 and 19, material 72 is removed from over insulative material 64 and metal-containing material 58, while leaving the material 72 within openings 66 and 68. Accordingly, the structure of FIGS. 18 and 19 has the electrically conductive material 72 formed to be within first and second openings 66 and 68, but not over segment 70 of insulative material 64.

Material 72 may be removed from over insulative material 64 and metal-containing material 58 by planarization, such as, for example, CMP.

The material 72 within opening 66 may be considered to be a first conductive structure 76 having a first upper surface 67; and the material 72 within opening 68 may be considered to be a second conductive structure 78 having a second upper surface 69. First conductive structure 76 is directly over upper surface 61 of interconnect 60. The first conductive structure 76 may be considered to electrically couple interconnect 60 with second metal-containing layer 58. A location of interconnect 60 is shown in dashed-line view in the top view of FIG. 19 to assist the reader in understanding the relative location of the interconnect to other structures shown in FIG. 19.

Second conductive structure 78 is laterally offset from first conductive structure 76, and is directly over and against insulative material 54.

Referring to FIGS. 20 and 21, patterned electrically insulative material 80 is formed over insulative material 64. Patterned material 80 may be referred to as a third insulative material to distinguish it from the first insulative material 54 and the second insulative material 64. Material 80 may be patterned utilizing processing similar to that discussed above for the patterning of material 22 of FIGS. 3 and 4. Insulative material 80 may, for example, comprise, consist essentially of, or consist of silicon dioxide.

Patterned material 80 has an opening 82 extending therethrough. Opening 82 may be referred to as a third opening to distinguish it from the first and second openings 66 and 68 of FIGS. 15 and 16. The third opening has a bottom periphery comprising upper surface 67 of the first conductive structure 76, and comprising upper surface 69 of the second conductive structure 78. The bottom periphery of opening 82 also comprises an upper surface of metal layer 58, and an upper surface of the segment 70 of insulative material 64.

The bottom periphery of opening 82 is shown to comprise an entirety of upper surface 69 of structure 78. However, structure 78 is a barrier structure similar to the structure 34 of FIGS. 10 and 11, and accordingly the bottom periphery of opening 82 may expose only a portion of upper surface 69 in some embodiments.

A nickel-containing material 84 is formed within opening 82. Material 84 is shown formed directly against upper surfaces of metal-containing layer 58, structures 76 and 78, and insulative material 64. The nickel-containing material may be formed by electroless plating on surfaces of metal-containing layer 58 and structures 76 and 78. The plating may then extend laterally to cover exposed insulative surfaces within opening 82. Nickel-containing material 84 may comprise, consist essentially of, or consist of nickel.

The nickel-containing material only partially fills opening 82, and a remainder of the opening is filled with electrically conductive material 86. Material 86 may, for example, comprise, consist essentially of, or consist of one or both of gold and palladium.

Structures 76 and 78 are similar to the bond pad 32 and barrier 34, respectively, described above with reference to FIGS. 10 and 11. Accordingly, structures 76 and 78 may comprise the same composition as one another and the same height as one another (as shown) or may comprise different compositions and/or heights relative to one another utilizing processing similar to that discussed above with reference to FIG. 12. Structures 76 and 78 may be referred to as comprising first and second electrically conductive materials, respectively, to indicate that the structures may or may not comprise the same electrically conductive material as one another.

Structure 78 comprises a lateral outer periphery 79, material 84 comprises a lateral outer periphery 85, and material 86 comprises a lateral outer periphery 87. The outer peripheries 85, 87 and 79 together form an outer conductive wall. Insulative materials 64 and 80 may comprise silicon dioxide along at least a portion of said wall. To the extent that the silicon dioxide separates from the outer conductive wall to form a crack extending to component 78, component 78 will be exposed to oxidation conditions. However, oxidation of component 78 will be precluded from propagating to component 76 by the intervening insulative structure 70.

Locations of electrically conductive structures 76 and 78, electrically insulative structure 70, metal-containing layer 58 and interconnect 60 are shown in dashed-line view in the top view of FIG. 21. The dashed-line view is used to indicate that such structures are under materials 84 and 86.

FIG. 21 shows that structure 76 comprises a lateral periphery 77. FIG. 21 also shows that second structure 78 laterally surrounds the lateral periphery 77.

Another embodiment of the invention is described with reference to FIGS. 22-33. Similar number will be used in describing the embodiment of FIGS. 22-33 as was used in describing the embodiment of FIGS. 13-21, where appropriate.

Figure 22:
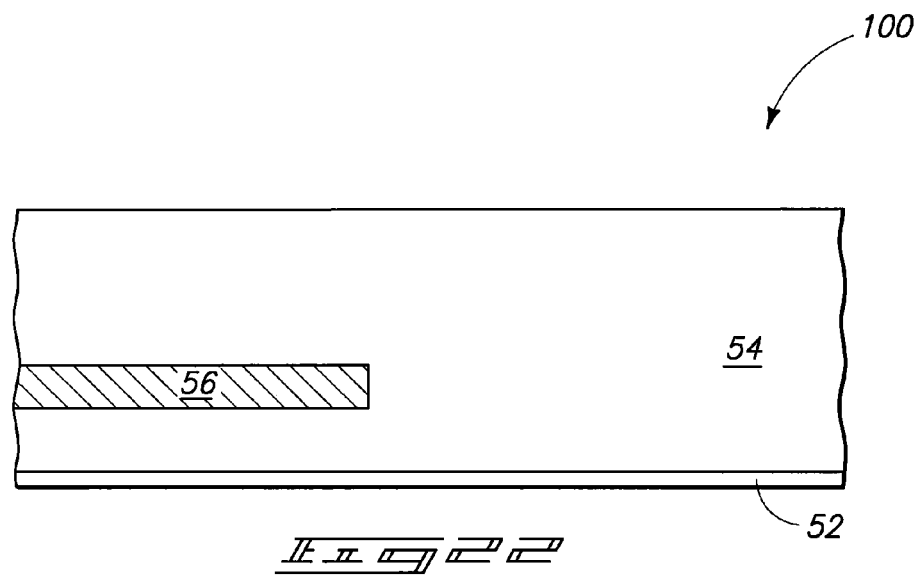
FIGS. 22 and 23 are a diagrammatic cross-sectional view and diagrammatic top view, respectively, of a semiconductor wafer fragment at a preliminary processing stage of another embodiment of the invention. The cross-section of FIG. 22 is along the line 22-22 of FIG. 23.
Figure 23:
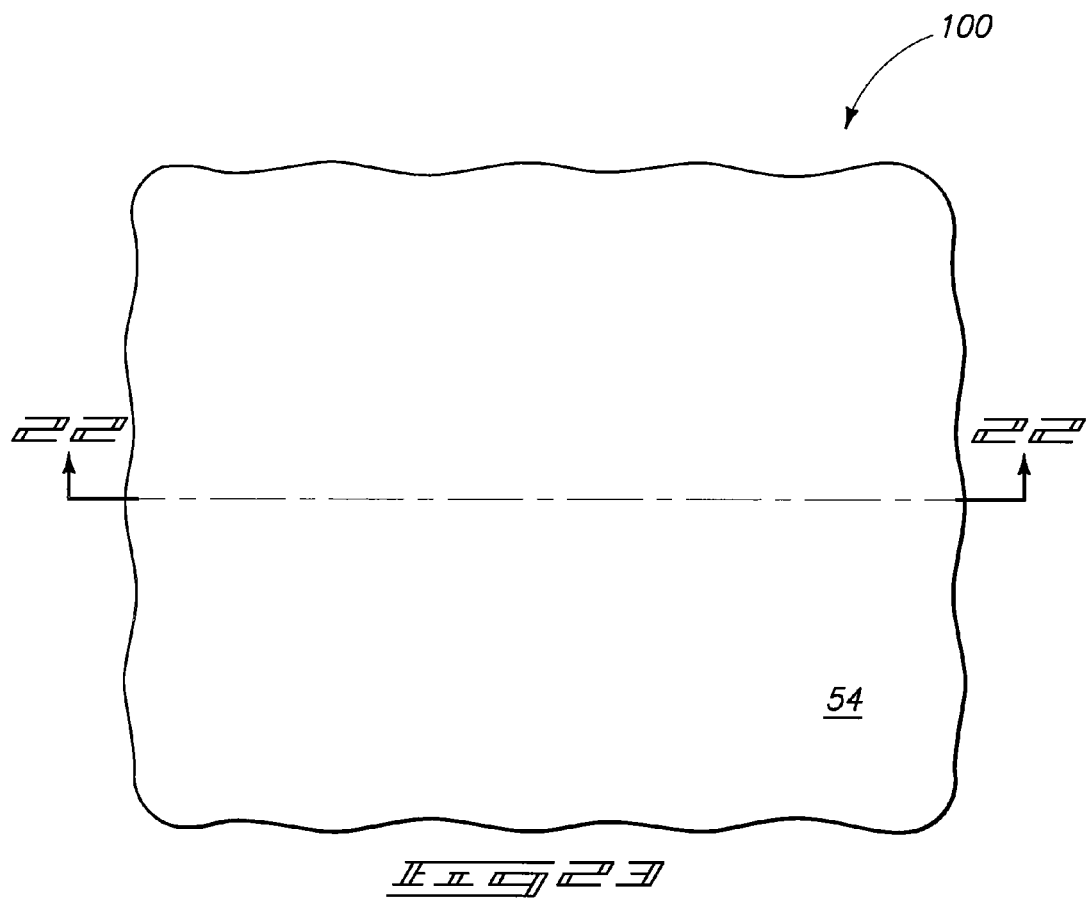

Referring to FIGS. 22 and 23, a semiconductor construction 100 is illustrated at a preliminary processing stage. Construction 100 comprises the semiconductor base 52, electrically insulative material 54, and metal-containing layer 56 discussed above. Although layer 56 is referred to as a metal-containing layer in the described embodiment, in other embodiments the layer 56 may be an electrically conductive material that does not contain metal, such as conductively-doped silicon.

Figure 24:
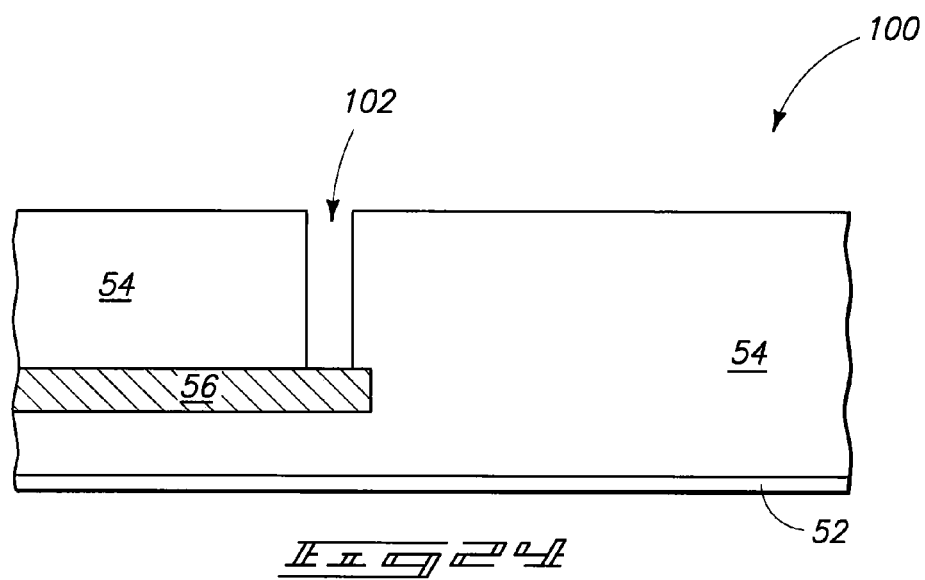
FIGS. 24 and 25 are a cross-sectional view and a top view, respectively, of the fragment of FIGS. 22 and 23 shown at a processing stage subsequent to that of FIGS. 22 and 23. The cross-section of FIG. 24 is along line 24-24 of FIG. 25.
Figure 25:
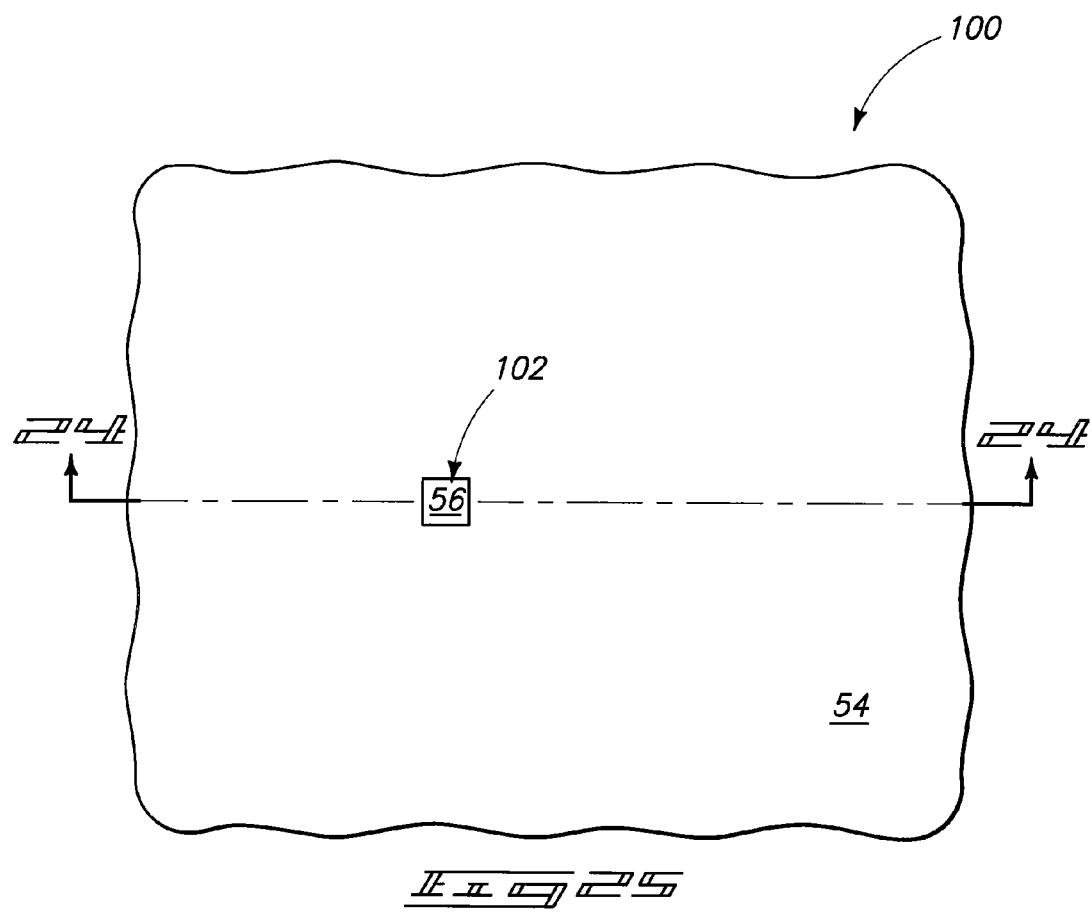

Referring to FIGS. 24 and 25, an opening 102 is extended through material 54 to an upper surface of electrically conductive layer 56. The opening can be formed by, for example, forming photolithographically patterned photoresist over material 54, extending a pattern defined by the photoresist through material 54 with one or more etches, and then removing the photoresist to leave the shown construction.

Figure 26:
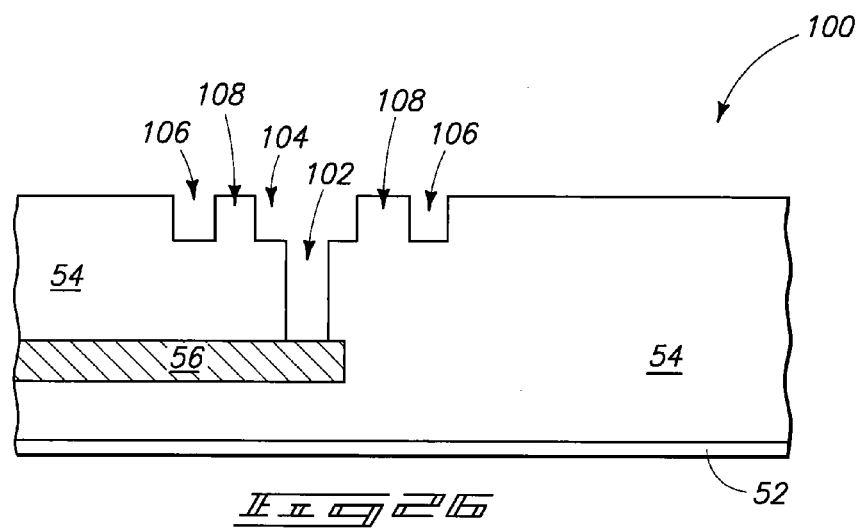
FIGS. 26 and 27 are a cross-sectional view and a top view, respectively, of the fragment of FIGS. 22 and 23 shown at a processing stage subsequent to that of FIGS. 24 and 25. The cross-section of FIG. 26 is along line 26-26 of FIG. 27.
Figure 27:
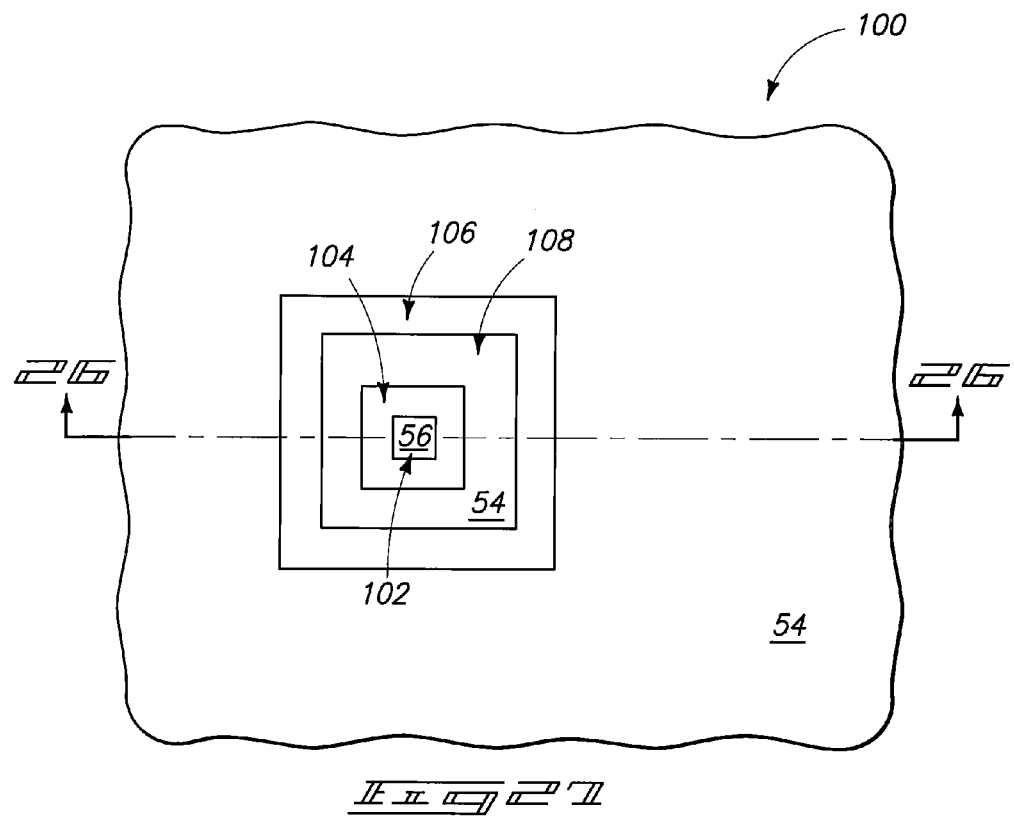

Referring to FIGS. 26 and 27, an upper portion of material 54 is patterned to form openings 104 and 106 extending into the material, and to leave a segment 108 of material 54 between openings 104 and 106. The opening 104 joins with opening 102, and may be considered to correspond to a widened upper portion of opening 102. Openings 102 and 104 may be considered to together form a first opening, and opening 106 may be considered to be a second opening laterally offset from the first opening. The segment 108 is an annular ring, as shown in the top view of FIG. 27.

The openings 104 and 106 can be formed by, for example, forming photolithographically patterned photoresist over material 54, extending a pattern defined by the photoresist into material 54 with one or more etches, and then removing the photoresist to leave the shown construction.

Figure 28:
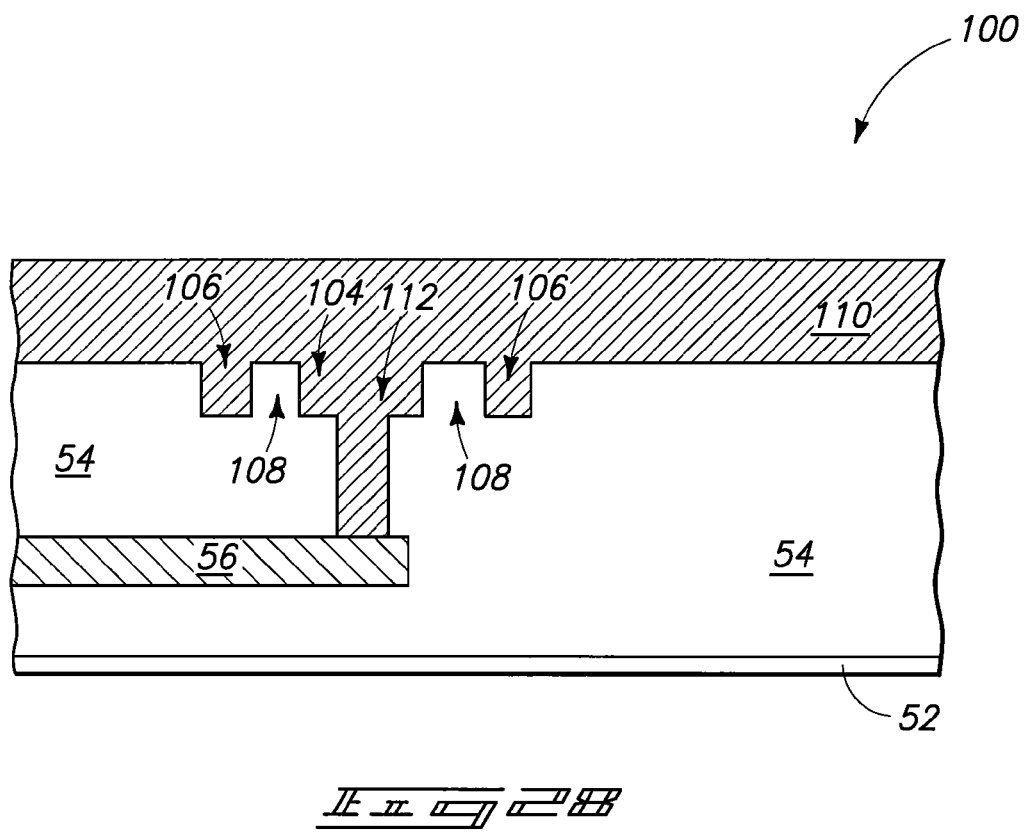
FIG. 28 is a view of the fragment of FIG. 22 shown at a processing stage subsequent to that of FIGS. 26 and 27.

Referring to FIG. 28, an electrically conductive material 110 is formed within openings 102, 104 and 106. Material 110 may comprise, consist essentially of, or consist of copper.

Figure 29:
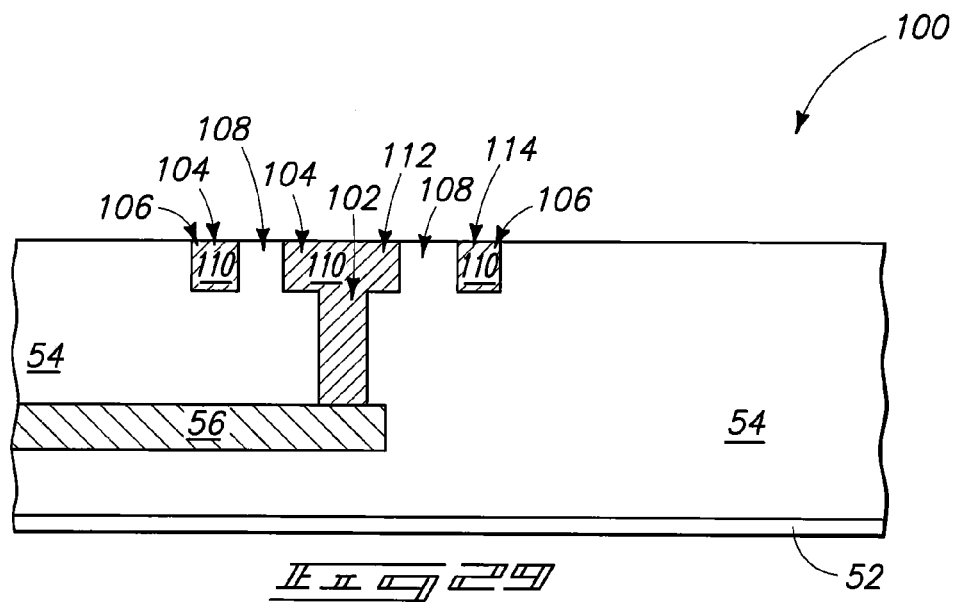
FIGS. 29 and 30 are a cross-sectional view and a top view, respectively, of the fragment of FIGS. 22 and 23 shown at a processing stage subsequent to that of FIG. 28. The cross-section of FIG. 29 is along line 29-29 of FIG. 30.
Figure 30:
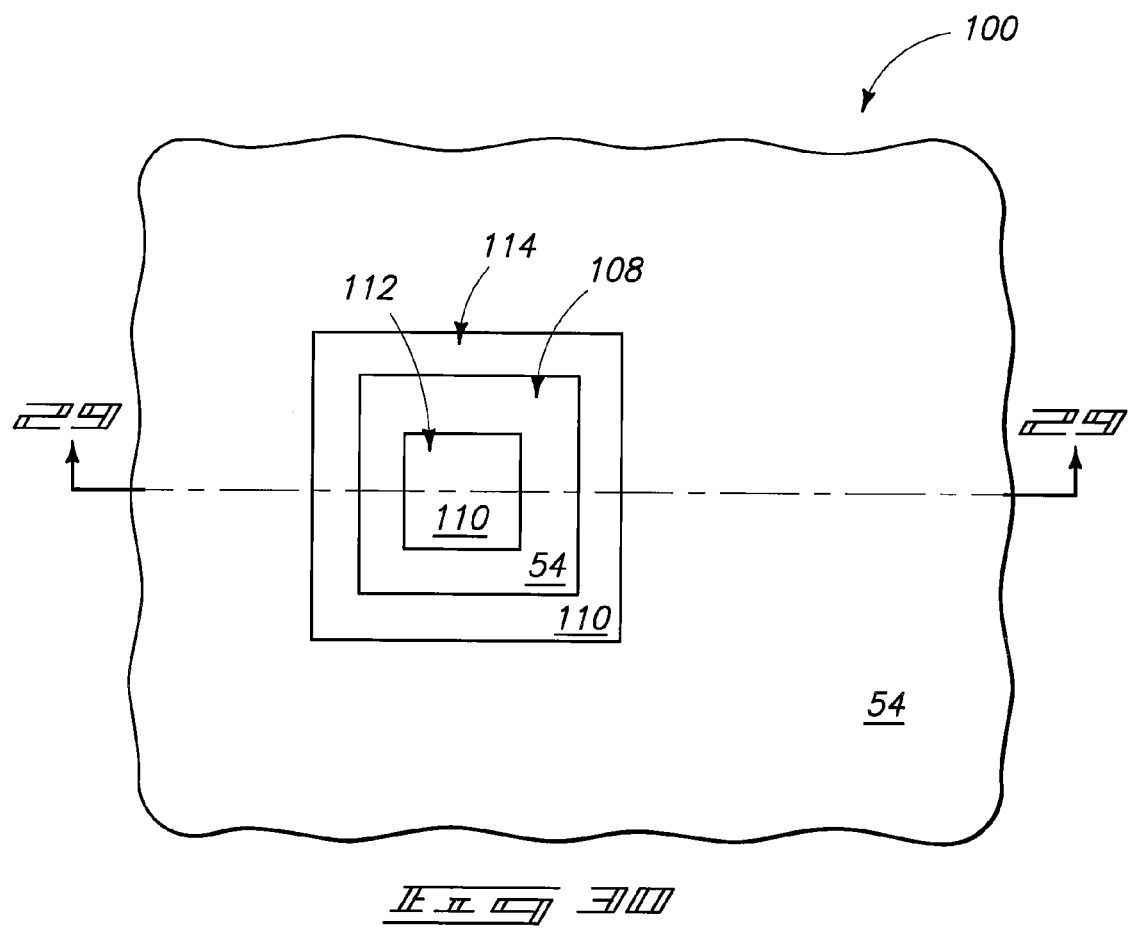

Referring to FIGS. 29 and 30, material 110 is removed from over insulative material 54, while leaving the material 110 within openings 102, 104 and 106. Accordingly, the structure of FIGS. 29 and 30 has the electrically conductive material 110 formed to be within openings 102, 104 and 106, but not over segment 108 of insulative material 54.

Material 110 may be removed from over insulative material 54 by planarization, such as, for example, CMP.

The material 110 within openings 102 and 104 may be considered to be a first conductive structure 112; and the material 110 within opening 106 may be considered to be a second conductive structure 114. The second conductive structure is spaced from the first conductive structure by the intervening segment 108 of insulative material 54.

Figure 31:
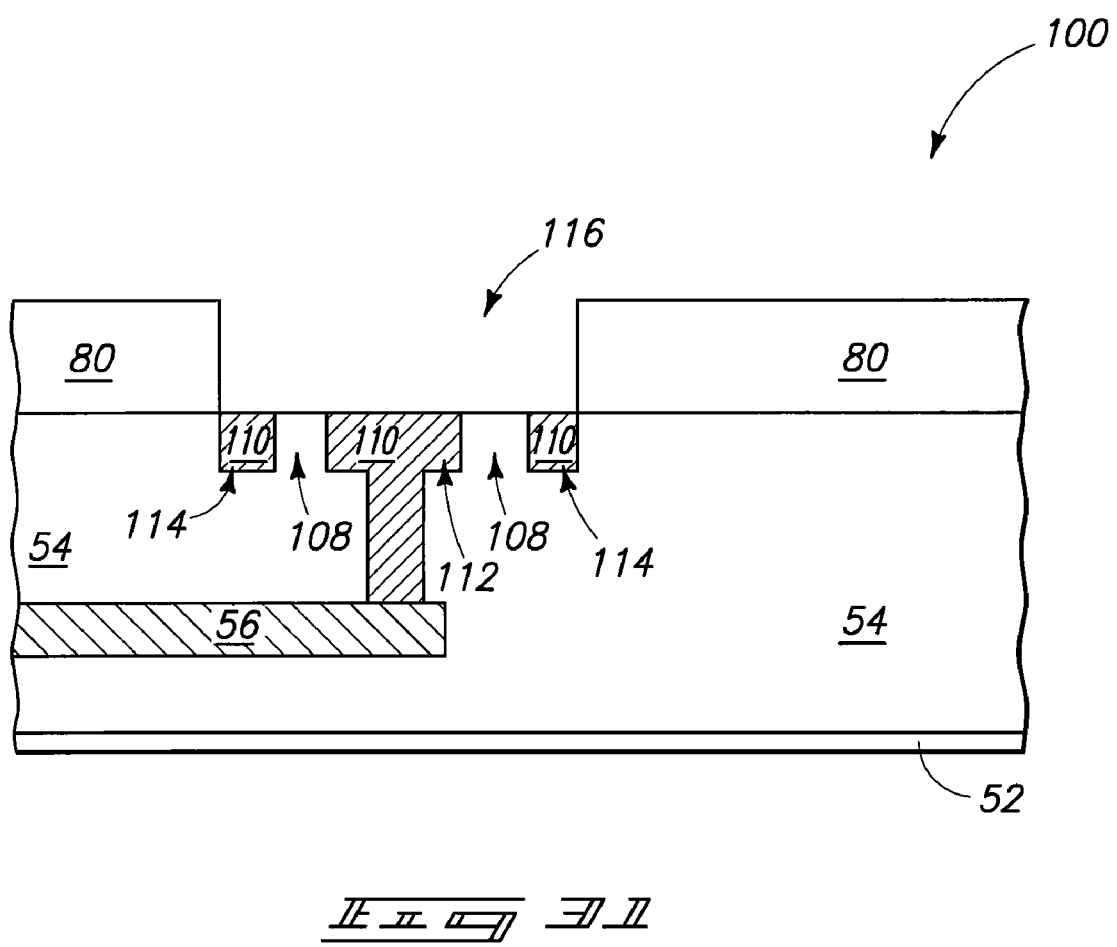
FIG. 31 is a view of the fragment of FIG. 22 shown at a processing stage subsequent to that of FIGS. 29 and 30.

Referring to FIG. 31, patterned electrically insulative material 80 is formed over insulative material 54. Patterned material 80 has an opening 116 extending therethrough to expose upper surfaces of conductive structures 112 and 114, and to expose an upper surface of the insulative segment 108. Material 80 may be patterned utilizing processing similar to that discussed above for the patterning of material 22 of FIGS. 3 and 4. Insulative material 80 may, for example, comprise, consist essentially of, or consist of one or both of silicon dioxide and silicon nitride, and may correspond to passivation material.

Figure 32:
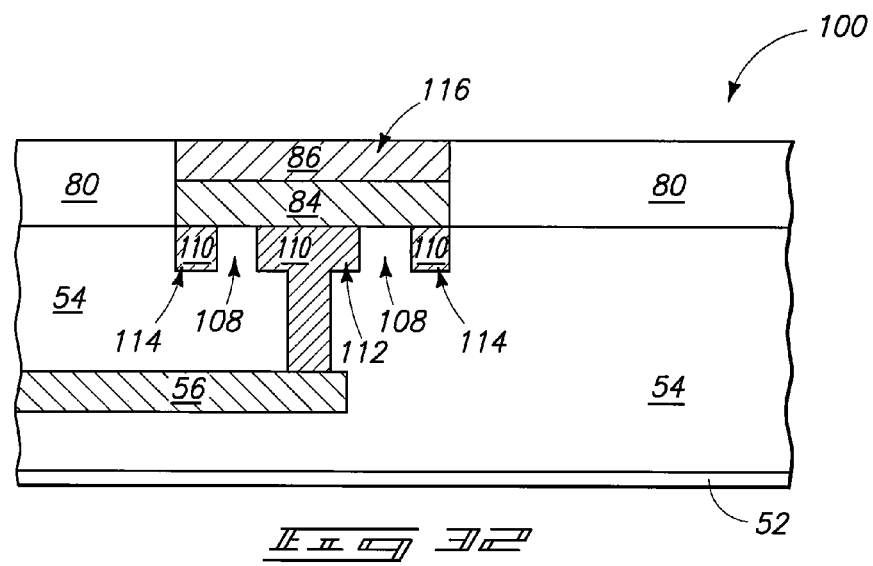
FIGS. 32 and 33 are a cross-sectional view and a top view, respectively, of the fragment of FIGS. 22 and 23 shown at a processing stage subsequent to that of FIG. 31. The cross-section of FIG. 32 is along line 32-32 of FIG. 33.
Figure 33:
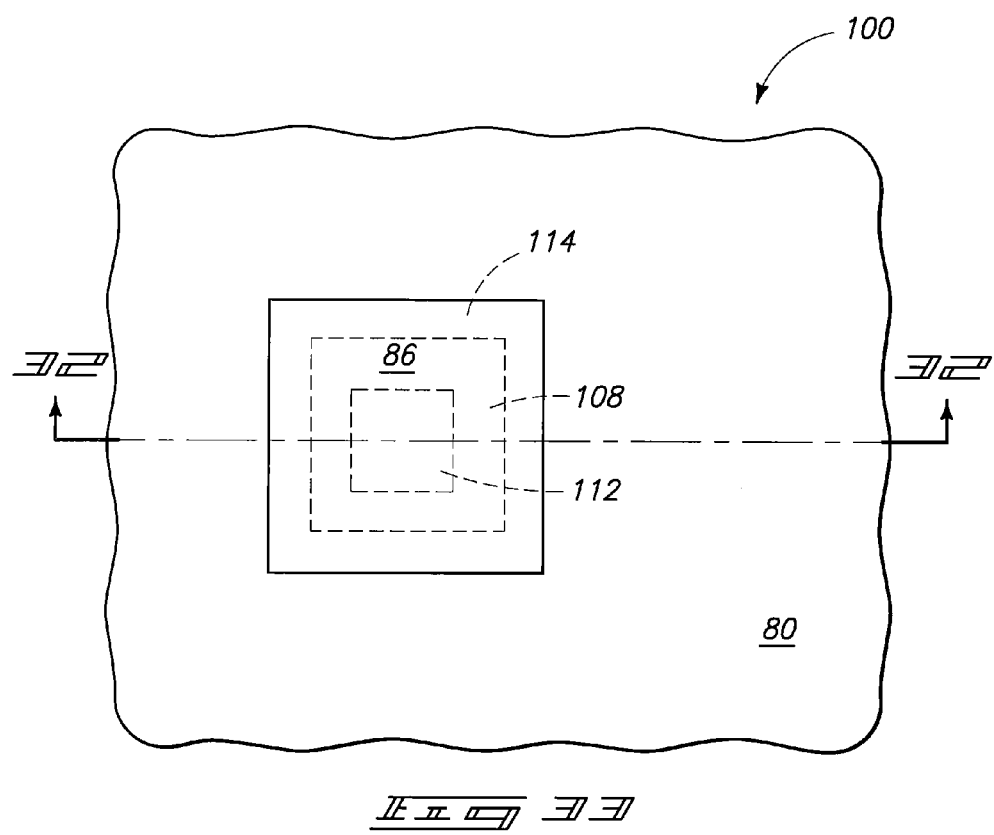

Referring to FIGS. 32 and 33, conductive materials 84 and 86 are formed within opening 116. Material 84 may comprise nickel, and material 86 may comprise one or both of gold and palladium, as discussed previously. Conductive structure 112 may be connected to a metal-containing layer at a level above metal-containing layer 56. For instance, layer 56 may be a metal I layer, and the conductive structure 112 may be electrically connected to a metal II layer.

Locations of electrically conductive structures 112 and 114, and electrically insulative structure 108, are shown in dashed-line view in the top view of FIG. 33. The dashed-line view is used to indicate that such structures are under material 86.

Another embodiment of the invention is described with reference to FIGS. 34-37. Similar number will be used in describing the embodiment of FIGS. 34-37 as was used in describing the embodiment of FIGS. 22-33, where appropriate.

Figure 34:
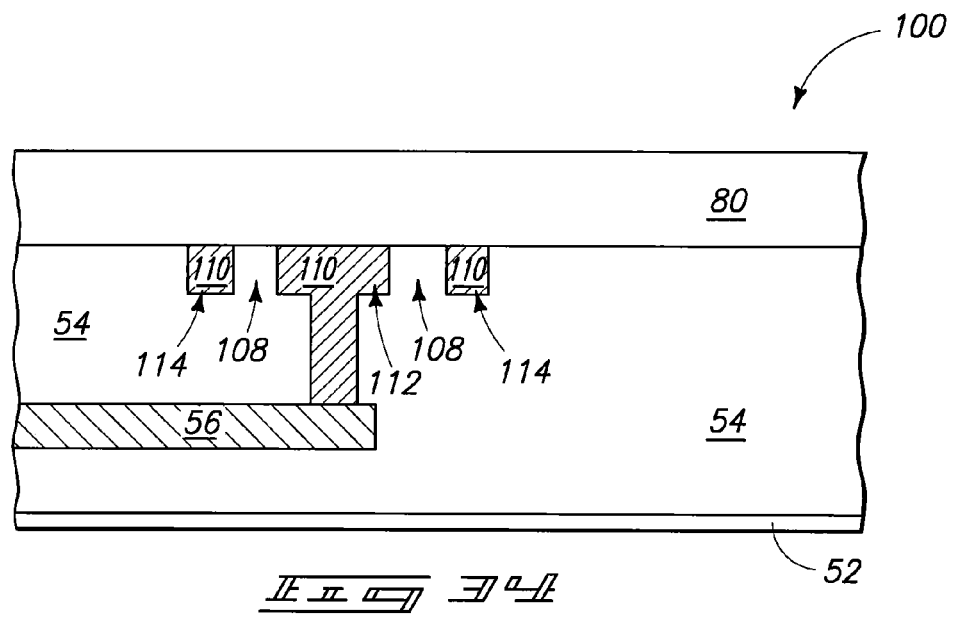
FIG. 34 is a view of the fragment of FIG. 22 shown at a processing stage subsequent to that of FIGS. 29 and 30 in accordance with another embodiment of the invention.

Referring to FIG. 34, construction 100 is shown at a processing stage subsequent to that of FIG. 29. Insulative material 80 is formed over insulative material 54.

Figure 35:
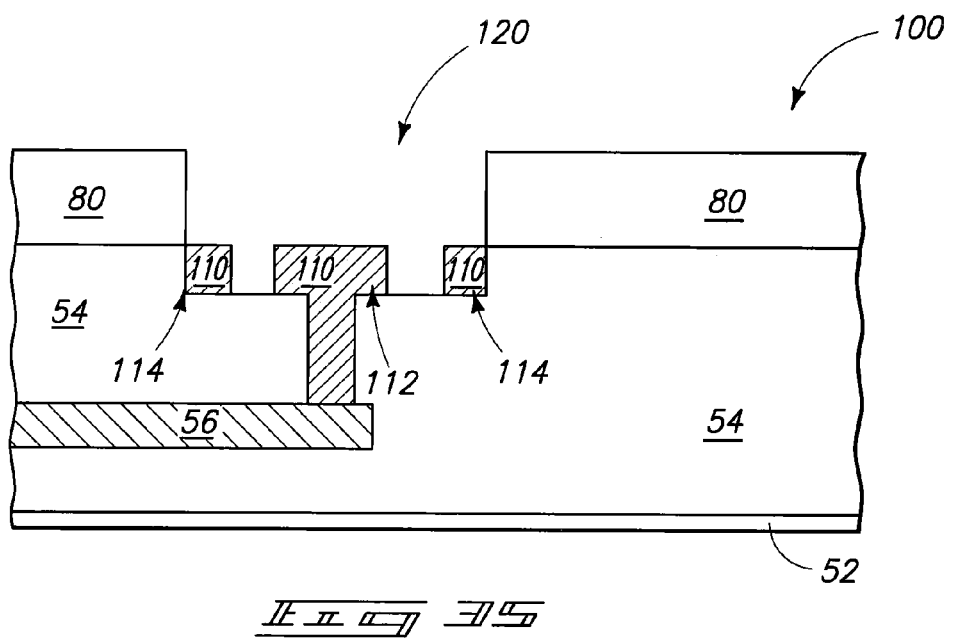
FIG. 35 is a view of the fragment of FIG. 22 shown at a processing stage subsequent to that of FIG. 34.

Referring to FIG. 35, material 80 is patterned to faun an opening 120 extending therethrough, and such opening also penetrates into material 54 to remove segment 108 (FIG. 34) of material 54. Opening 120 may be formed by, for example, forming photolithographically patterned photoresist over material 80, extending a pattern defined by the photoresist into materials 54 and 80 with one or more etches, and then removing the photoresist to leave the shown construction.

Figure 36:
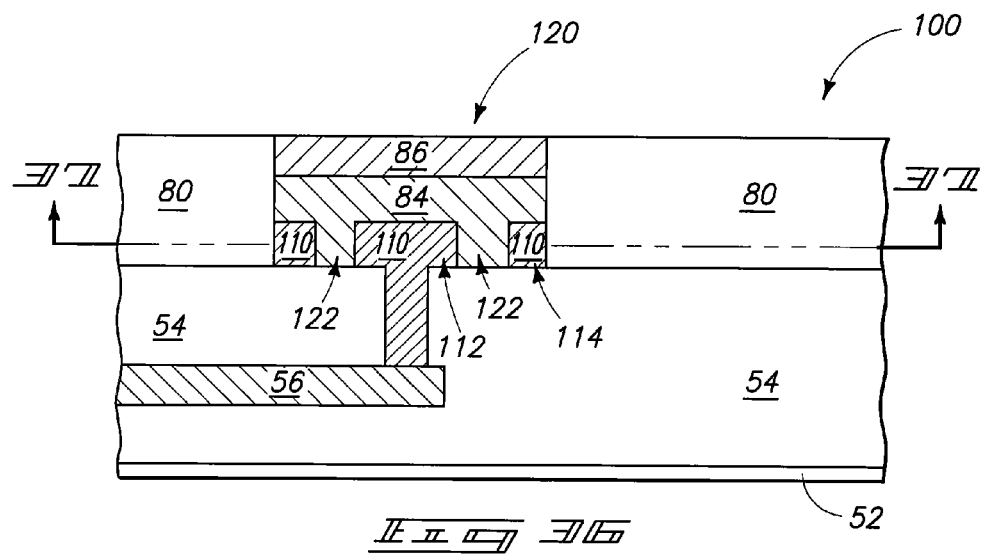
FIG. 36 is a view of the fragment of FIG. 22 shown at a processing stage subsequent to that of FIG. 35.
Figure 37:
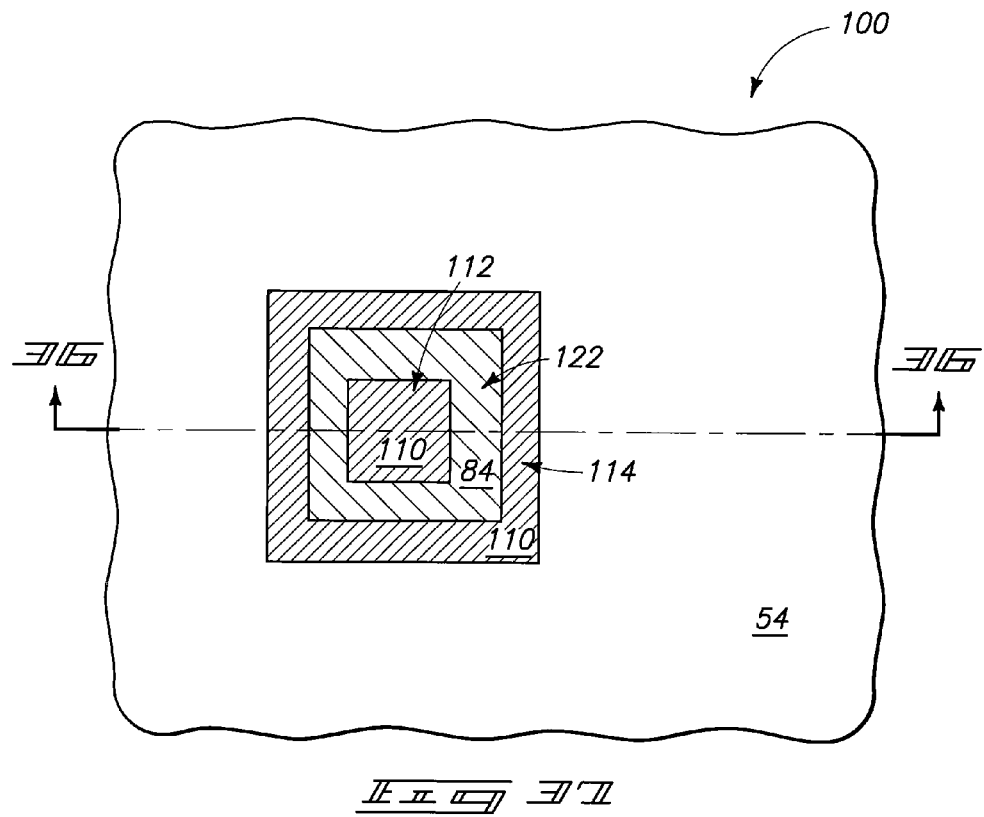
FIG. 37 is a cross-sectional view of the fragment of FIG. 36 shown along the line 37-37 of FIG. 36. The cross-section of FIG. 36 is along the line 36-36 of FIG. 37.

Referring to FIGS. 36 and 37, conductive materials 84 and 86 are formed within opening 120. Material 84 may comprise nickel, and material 86 may comprise one or both of gold and palladium, as discussed previously. The material 84 replaces segment 108 (FIG. 34) to create a spacer 122 between conductive components 112 and 114. Spacer 122 forms an annular ring around component 110, as shown in the cross-section of FIG. 37.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction, comprising:
   a first electrically conductive structure over a semiconductor substrate, the first electrically conductive structure having a lateral periphery;
   a second electrically conductive structure over the semiconductor substrate and surrounding an entirety of the lateral periphery of the first electrically conductive structure; the second electrically conductive structure having an outer lateral edge;
   a ring of electrically insulative material between the first and second electrically conductive structures; a planar horizontal surface extending along the first electrically conductive structure, the second electrically conductive structure and the ring of electrically insulative material; and a segment of nickel-containing material along the planar horizontal surface and in direct contact with the first and second electrically conductive structures and with the ring of electrically insulative material; the segment of nickel-containing material having an outer lateral edge; a planar vertical surface extending along the outer lateral edges of the nickel-containing material and the second electrically conductive structure.

2. The construction of claim 1 wherein the first and second electrically conductive structures are the same composition as one another.

3. The construction of claim 2 wherein the first and second electrically conductive structures both comprise copper.

4. The construction of claim 2 wherein the first and second electrically conductive structures both consist of copper.

5. A semiconductor construction, comprising:
a first electrically conductive structure over a semiconductor substrate, the first electrically conductive structure having a lateral periphery;
a second electrically conductive structure over the semiconductor substrate and surrounding an entirety of the lateral periphery of the first electrically conductive structure;
a ring of electrically insulative material between the first and second electrically conductive structures;
a segment of nickel-containing material over and in direct contact with the first and second electrically conductive structures and with the ring of electrically insulative material; and
wherein the first and second electrically conductive structures are different in composition from one another.

6. The construction of claim 5 wherein the first electrically conductive structure comprises copper and the second electrically conductive structure comprises aluminum.

7. A semiconductor construction, comprising:
a semiconductor substrate comprising an electrically conductive lead;
an electrically conductive bond pad electrically coupled with the electrically conductive lead, the electrically conductive bond pad having a lateral periphery; the electrically conductive bond pad comprising a first composition;
a first electrically insulative material over the electrically conductive lead and laterally surrounding the electrically conductive bond pad;
an electrically conductive annulus laterally surrounding the an entire lateral periphery of the electrically conductive bond pad; the electrically conductive annulus comprising a second composition; the electrically conductive annulus having an outer lateral edge;
a ring of second electrically insulative material between the electrically conductive annulus and the electrically conductive bond pad; a planar horizontal surface extending along the electrically conductive bond pad, the electrically conductive annulus and the ring of electrically insulative material; and
a segment of electrically conductive material over along the planar horizontal surface and in direct contact with the first composition of the electrically conductive bond pad, the second composition of the electrically conductive annulus, and the ring of second electrically insulative material; the segment of electrically conductive material consisting of a third composition which is different from the first and second compositions; the segment of electrically conductive material having an outer lateral edge; a planar vertical surface extending along the outer lateral edges of the segment of electrically conductive material and the electrically conductive annulus.

8. The construction of claim 7 wherein the planar vertical surface is an outer conductive wall; and further comprising silicon dioxide along at least a portion of said outer conductive wall.

9. The construction of claim 7 wherein the ring of electrically insulative material consists of silicon dioxide.

10. The construction of claim 7 wherein the first and second compositions are the same as one another.

11. The construction of claim 7 wherein the first and second compositions both consist of copper.

12. The construction of claim 7 wherein the third composition is nickel.

13. A semiconductor construction, comprising:
a semiconductor substrate comprising an electrically conductive lead;
an electrically conductive bond pad electrically coupled with the electrically conductive lead, the electrically conductive bond pad having a lateral periphery; the electrically conductive bond pad comprising a first composition;
a first electrically insulative material over the electrically conductive lead and laterally surrounding the electrically conductive bond pad;
an electrically conductive annulus laterally surrounding an entire lateral periphery of the electrically conductive bond pad; the electrically conductive annulus comprising a second composition;
a ring of second electrically insulative material between the electrically conductive annulus and the electrically conductive bond pad;
a segment of electrically conductive material over and in direct contact with the first composition of the electrically conductive bond pad, the second composition of the electrically conductive annulus, and the ring of second electrically insulative material; the segment of electrically conductive material consisting of a third composition which is different from the first and second compositions; and
wherein the first and second compositions are different from one another.

* * * * *

UNITED STATES PATENT AND TRADEMARK OFFICE
CERTIFICATE OF CORRECTION

PATENT NO. : 8,288,867 B2
APPLICATION NO. : 12/785263
DATED : October 16, 2012
INVENTOR(S) : Tianhong Zhang et al.

It is certified that error appears in the above-identified patent and that said Letters Patent is hereby corrected as shown below:

In column 12, line 4, in Claim 7, delete "over along" and insert -- along --, therefor.

Signed and Sealed this
Twenty-fifth Day of December, 2012

David J. Kappos
*Director of the United States Patent and Trademark Office*